(12) United States Patent
Shim et al.

(10) Patent No.: US 12,093,477 B2
(45) Date of Patent: Sep. 17, 2024

(54) SENSING SYSTEM WITH CODE PATTERN AND DISPLAY DEVICE INCLUDING THE SAME

(71) Applicant: SAMSUNG DISPLAY CO., LTD., Yongin-si (KR)

(72) Inventors: Chang Woo Shim, Cheonan-si (KR); Won Sang Park, Yongin-si (KR); Gi Na Yoo, Cheonan-si (KR); Seong Jun Lee, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 126 days.

(21) Appl. No.: 17/652,794

(22) Filed: Feb. 28, 2022

(65) Prior Publication Data

US 2023/0015262 A1 Jan. 19, 2023

(30) Foreign Application Priority Data

Jul. 16, 2021 (KR) .......................... 10-2021-0093469

(51) Int. Cl.
| | | |
|---|---|---|
| *G06F 3/041* | (2006.01) | |
| *G06F 3/03* | (2006.01) | |
| *G06F 3/0354* | (2013.01) | |
| *G06F 3/044* | (2006.01) | |
| *H10K 50/86* | (2023.01) | |

(Continued)

(52) U.S. Cl.
CPC .......... *G06F 3/0412* (2013.01); *G06F 3/0321* (2013.01); *G06F 3/03542* (2013.01); *G06F 3/04162* (2019.05); *G06F 3/0446* (2019.05); *H10K 50/865* (2023.02);

(Continued)

(58) Field of Classification Search
CPC ...... H10K 59/40; H10K 59/38; H10K 50/865; G06F 2203/04111; G06F 3/0446; G06F 3/04162; G06F 3/0412; G06F 3/03542; G06F 3/0321
See application file for complete search history.

(56) References Cited

U.S. PATENT DOCUMENTS

2013/0082907 A1* 4/2013 Yun ....................... G06F 3/0412
 345/55
2014/0168089 A1* 6/2014 Geaghan ............. G06F 3/03542
 345/173

(Continued)

FOREIGN PATENT DOCUMENTS

| KR | 10-2018-0000040 | 1/2018 |
| KR | 10-2019-0016635 | 2/2019 |

(Continued)

*Primary Examiner* — Liliana Cerullo
(74) *Attorney, Agent, or Firm* — F. Chau & Associates, LLC

(57) ABSTRACT

A display panel includes a plurality of emission areas emitting light and a light blocking area at least partially surrounding the plurality of emission areas, a plurality of touch electrodes disposed in the light blocking area on the display panel to sense a touch, a wavelength absorption layer disposed on the plurality of touch electrodes to absorb light of a specific wavelength, a bridge electrode disposed on the wavelength absorption layer to connect adjacent touch electrodes among the plurality of touch electrodes to each other, and a code pattern having position information determined by a planar shape of the bridge electrode.

19 Claims, 20 Drawing Sheets

(51) Int. Cl.
  *H10K 59/126*  (2023.01)
  *H10K 59/40*  (2023.01)
  H10K 59/38  (2023.01)

(52) U.S. Cl.
  CPC .......... *H10K 59/126* (2023.02); *H10K 59/40* (2023.02); *G06F 2203/04111* (2013.01); *H10K 59/38* (2023.02)

(56) References Cited

U.S. PATENT DOCUMENTS

| | | | | |
|---|---|---|---|---|
| 2014/0184507 | A1* | 7/2014 | Yamada | G06F 3/0304 345/158 |
| 2014/0247228 | A1* | 9/2014 | Mortel | G06F 3/041 345/173 |
| 2015/0301624 | A1* | 10/2015 | Lee | G06F 3/0321 345/179 |
| 2016/0364039 | A1 | 12/2016 | Yamada et al. | |
| 2019/0018530 | A1* | 1/2019 | Lee | H10K 50/8445 |
| 2021/0232262 | A1* | 7/2021 | Feng | G06F 3/0443 |
| 2022/0229329 | A1* | 7/2022 | Ito | G06V 40/1318 |

FOREIGN PATENT DOCUMENTS

| | | |
|---|---|---|
| KR | 10-2020-0033362 | 3/2020 |
| KR | 10-2104027 | 4/2022 |

\* cited by examiner

US 12,093,477 B2

SENSING SYSTEM WITH CODE PATTERN AND DISPLAY DEVICE INCLUDING THE SAME

CROSS-REFERENCE TO RELATED APPLICATION

This application claims priority under 35 U.S.C. § 119 to Korean Patent Application No. 10-2021-0093469 filed on Jul. 16, 2021, in the Korean Intellectual Property Office, the contents of which are herein incorporated by reference in their entirety.

TECHNICAL FIELD

The present disclosure relates to a display and, more specifically, to a display device and a sensing system including the same.

DISCUSSION OF THE RELATED ART

Display devices are widely used in various electronic devices for displaying images. For example, display devices are employed in smartphones, digital cameras, laptop computers, navigation devices, and smart televisions. The display device may be a flat panel display device such as a liquid crystal display (LCD) device, a field emission display device, and an organic light emitting diode (OLED) display device. While some types of flat panel display devices require a backlight device to create illumination, some display panels such as the OLED display device include light emitting elements capable of emitting light by themselves, thereby being able to display an image without the need for a backlight.

Many display devices are able to sense a touch input provided by a user, such as by a part of the user's body (e.g., a finger) and/or by a pen/stylus device. The use of a stylus may allow the display device to detect the input with more sensitively than when a part of a user's body is used.

SUMMARY

A display device includes a display including a plurality of emission areas emitting light and a light blocking area surrounding the plurality of emission areas. A plurality of touch electrodes is disposed in the light blocking area on the display to sense a touch. A wavelength absorption layer is disposed on the plurality of touch electrodes to absorb light of a specific wavelength. A bridge electrode is disposed on the wavelength absorption layer to connect adjacent touch electrodes among the plurality of touch electrodes to each other. A code pattern having position information determined by a planar shape of the bridge electrode is included within the display device.

The wavelength absorption layer may be disposed in the plurality of emission areas or the light blocking area.

The wavelength absorption layer may transmit visible light and may absorb infrared or ultraviolet light.

The code pattern may have a closed loop shape.

The display may include a substrate, a thin film transistor layer disposed on the substrate and including a plurality of thin film transistors, a light emitting element layer disposed on the thin film transistor layer and including a plurality of light emitting elements, and an encapsulation layer covering the light emitting element layer. The plurality of touch electrodes may be disposed on the encapsulation layer.

The display device may further include a light blocking pattern disposed on at least a part of the bridge electrode to absorb light of a specific wavelength.

The display device may further include a plurality of color filters disposed in the plurality of emission areas on the wavelength absorption layer, and a light blocking part disposed in the light blocking area on the wavelength absorption layer. The light blocking part may cover the bridge electrode.

The display device may further include a wavelength conversion part disposed on the display to correspond to the plurality of emission areas to convert a peak wavelength of light provided from the plurality of light emitting elements, and a light blocking part at least partially surrounding the wavelength conversion part. The plurality of touch electrodes may be disposed on the light blocking part, and the wavelength absorption layer may be disposed on the plurality of touch electrodes, the wavelength conversion part, and the light blocking part.

The display device may further include a wavelength conversion part disposed on the wavelength absorption layer to correspond to the plurality of emission areas to convert a peak wavelength of light provided from the plurality of light emitting elements, and a light blocking part at least partially surrounding the wavelength conversion part and covering the bridge electrode.

The display may include a first substrate, a thin film transistor layer disposed on the first substrate and including a plurality of thin film transistors, and a light emitting element layer disposed on the thin film transistor layer and including a plurality of light emitting elements. The display device may further include a polarizing film disposed on the light emitting element layer, and a second substrate disposed on the polarizing film. The plurality of touch electrodes may be disposed on the second substrate.

A display device includes a display including a plurality of emission areas emitting light and a light blocking area at least partially surrounding the plurality of emission areas. A plurality of touch electrodes is disposed in the light blocking area on the display to sense a touch. An insulating layer is disposed on the plurality of touch electrodes. A bridge electrode is disposed on the insulating layer to connect adjacent touch electrodes among the plurality of touch electrodes to each other. A light blocking pattern is disposed on at least a part of the bridge electrode to absorb light of a specific wavelength. A code pattern having position information determined by a planar shape of the light blocking pattern is included within the display device.

The bridge electrode may reflect infrared or ultraviolet light, and the light blocking pattern may absorb infrared or ultraviolet light.

As used herein, the phrase "reflects" may mean that most of (e.g., a majority of) light of the specified type is reflected. As used herein, the phrase "absorbed" may mean that most of (e.g., a majority of) the light of the specified type is absorbed. Thus, where it is said that the bridge electrode may reflect infrared or ultraviolet light, this may mean that more infrared/ultraviolet light is reflected by the bridge electrode than is absorbed or transmitted and where it is said that the light blocking pattern may absorb infrared or ultraviolet light, this may mean that more infrared/ultraviolet light is absorbed by the light blocking pattern than is reflected or transmitted.

The code pattern may have a closed loop shape.

The display may include a substrate, a thin film transistor layer disposed on the substrate and including a plurality of thin film transistors, a light emitting element layer disposed on the thin film transistor layer and including a plurality of light emitting elements, and an encapsulation layer covering the light emitting element layer. The plurality of touch electrodes may be disposed on the encapsulation layer.

The display device may further include a plurality of color filters disposed in the plurality of emission areas on the insulating layer, and a light blocking part disposed in the light blocking area on the insulating layer. The light blocking part may cover the bridge electrode and the light blocking pattern.

The display device may further include a wavelength conversion part disposed on the display to correspond to the plurality of emission areas to convert a peak wavelength of light provided from the plurality of light emitting elements, and a light blocking part at least partially surrounding the wavelength conversion part. The plurality of touch electrodes may be disposed on the light blocking part, and the insulating layer may be disposed on the plurality of touch electrodes, the wavelength conversion part, and the light blocking part.

The display device may further include a wavelength conversion part disposed on the insulating layer to correspond to the plurality of emission areas to convert a peak wavelength of light provided from the plurality of light emitting elements, and a light blocking part at least partially surrounding the wavelength conversion part and covering the bridge electrode and the light blocking pattern.

The display may include a first substrate, a thin film transistor layer disposed on the first substrate and including a plurality of thin film transistors, and a light emitting element layer disposed on the thin film transistor layer and including a plurality of light emitting elements. The display device may further include a polarizing film disposed on the light emitting element layer, and a second substrate disposed on the polarizing film. The plurality of touch electrodes may be disposed on the second substrate.

A display device incudes a display including a plurality of emission areas emitting light and a light blocking area at least partially surrounding the plurality of emission areas. A plurality of touch electrodes is disposed in the light blocking area on the display to sense a touch. A plurality of bridge electrodes is disposed between the display and the plurality of touch electrodes to connect adjacent touch electrodes among the plurality of touch electrodes to each other. A first wavelength absorption layer is disposed on some of the plurality of bridge electrodes to absorb light of a specific wavelength. The display device further includes a code pattern having position information determined by a planar shape of the bridge electrodes not covered by the first wavelength absorption layer.

The display device may further include a second wavelength absorption layer disposed on some of the plurality of touch electrodes to absorb light of the specific wavelength.

A sensing system includes a display device configured to display an image, and an input device configured to input a touch onto the display device. The display device includes a display including a plurality of emission areas emitting light and a light blocking area at least partially surrounding the plurality of emission areas. A plurality of touch electrodes is disposed in the light blocking area on the display to sense a touch. A wavelength absorption layer is disposed on the plurality of touch electrodes to absorb light of a specific wavelength. A bridge electrode is disposed on the wavelength absorption layer to connect adjacent touch electrodes among the plurality of touch electrodes to each other. The sensing system further includes a code pattern having position information determined by a planar shape of the bridge electrode. The input device photographs the code pattern, converts the code pattern into a preset data code, and transmits coordinate data composed of the data codes to the display device.

The input device may include a camera configured to photograph the code pattern, a processor configured to analyze an image of the code pattern, convert the code pattern into a preset data code, and generate coordinate data composed of the data codes, and a communication module configured to transmit the coordinate data to the display device.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

Figure 1:
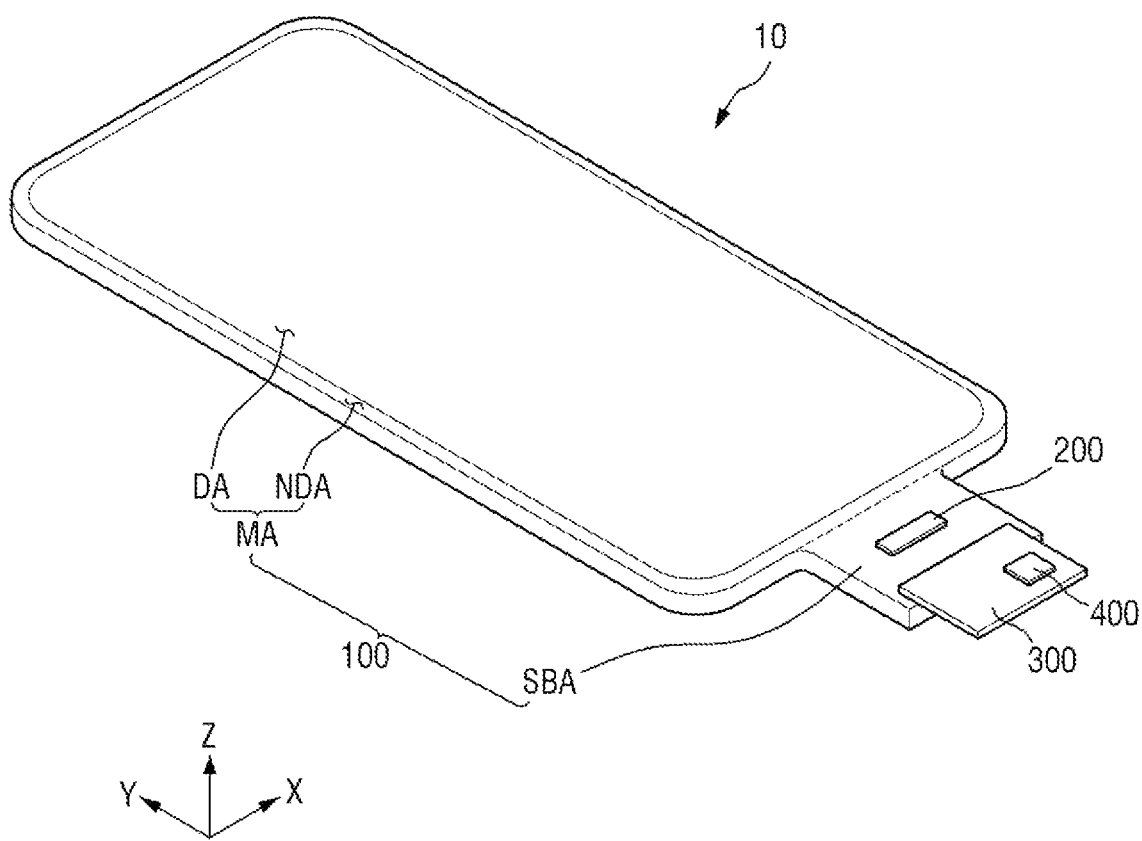
FIG. 1 is a perspective view showing a display device according to an embodiment of the present disclosure.

In the accompanying drawings, while the size and relative sizes of elements, angles shown, and relative orientation does indeed depict at least one embodiment of the present disclosure, it is noted that the present invention is not necessarily limited to the particular arrangements shown. Although embodiments of the present disclosure may be implemented in the particular order disclosed herein, it is to be understood that changes to the order may be made. For example, two consecutively described processes may be performed substantially at the same time or performed in an order opposite to the described order. Also, like reference numerals may denote like elements throughout the specification and the drawings.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

Although the terms "first," "second," and the like may be used herein to describe various types of elements, these elements should not necessarily be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms may encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly. However, it is noted that these statements are not meant to be interpreted as meaning that the specific structures set forth herein are not in fact actual embodiments of the present disclosure, because all structures set forth herein are indeed meant to be example embodiments of the present discourse, in the particular manner described.

As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation, not as terms of degree, and thus are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, may be made. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature, and the shapes of these regions might not reflect actual shapes of regions of a device.

As customary in the field, some embodiments are described and illustrated in the accompanying drawings in terms of functional blocks, units, parts, and/or modules. Those skilled in the art will appreciate that these blocks, units, parts, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, parts, and/or modules being implemented by microprocessors or other similar hardware, they may be programmed and controlled using software (e.g., microcode) to perform various functions discussed herein and may optionally be driven by firmware and/or software. It is also contemplated that each block, unit, part, and/or module may be implemented by dedicated hardware, or as a combination of dedicated hardware to perform some functions and a processor (e.g., one or more programmed microprocessors and associated circuitry) to perform other functions. Also, each block, unit, part, and/or module of some embodiments may be physically separated into two or more interacting and discrete blocks, units, parts, and/or modules without departing from the scope of the disclosure. Further, the blocks, units, parts, and/or modules of some embodiments may be physically combined into more complex blocks, units, parts, and/or modules without departing from the scope of the disclosure.

Hereinafter, detailed embodiments of the present disclosure will be described with reference to the accompanying drawings.

FIG. 1 is a perspective view showing a display device according to an embodiment of the present disclosure.

Referring to FIG. 1, a display device 10 may be applied to portable electronic devices such as a mobile phone, a smartphone, a tablet personal computer, a mobile communication terminal, an electronic organizer, an electronic book, a portable multimedia player (PMP), a navigation system, an ultra mobile PC (UMPC) or the like. For example, the display device 10 may be applied as a display of a television, a laptop, a monitor, a billboard, or an Internet-of-Things (IoT) device. As an example, the display device 10 may be applied to wearable devices such as a smart watch, a watch phone, a glasses type display, or a head mounted display (HMD).

The display device 10 may have a planar shape similar to a quadrilateral shape. For example, the display device 10 may have a shape similar to a quadrilateral shape, in a plan view, having a pair of short sides in an X-axis direction and a pair of long sides in a Y-axis direction. The corner where the short side in the X-axis direction and the long side in the Y-axis direction meet may be rounded to have a predetermined curvature or may be right-angled. The planar shape of the display device 10 is not necessarily limited to a quadrilateral shape, and may be formed in a shape similar to another polygonal shape, a circular shape, or elliptical shape.

The display device 10 may include the display panel 100, the display driver 200, the circuit board 300, and the touch driver 400.

The display panel 100 may include a main region MA and a sub-region SBA.

The main region MA may include the display area DA including pixels displaying an image and the non-display area NDA disposed at least partially around the display area DA. The display area DA may emit light from a plurality of emission areas or a plurality of opening areas. For example, the display panel 100 may include a pixel circuit including switching elements, a pixel defining layer defining an emission area or an opening area, and a self-light emitting element.

For example, the self-light emitting element may include an organic light emitting diode including an organic light emitting layer, a quantum dot light emitting diode including a quantum dot light emitting layer, an inorganic light emitting diode including an inorganic semiconductor, and/or a micro light emitting diode (micro LED), but the present disclosure is not necessarily limited thereto.

The non-display area NDA may be an area outside of the display area DA. The non-display area NDA may be defined as an edge area of the main region MA of the display panel 100. The non-display area NDA may include a gate driver that supplies gate signals to the gate lines, and fan-out lines that connect the display driver 200 to the display area DA.

The sub-region SBA may extend from one side of the main region MA. The sub-region SBA may include a flexible material which can be bent, folded or rolled to an observable extent without cracking or otherwise sustaining damage. For example, when the sub-region SBA is bent, the sub-region SBA may overlap the main region MA in a thickness direction (Z-axis direction). The sub-region SBA may include the display driver 200 and the pad connected to the circuit board 300. Optionally, the sub-region SBA may be omitted, and the display driver 200 and the pad may be arranged in the non-display area NDA.

The display driver 200 may output signals and voltages for driving the display panel 100. The display driver 200 may supply data voltages to data lines. The display driver 200 may supply a power voltage to the power line and may supply a gate control signal to the gate driver. The display driver 200 may be formed as an integrated circuit (IC) and mounted on the display panel 100 by a chip on glass (COG) method, a chip on plastic (COP) method, or an ultrasonic bonding method. For example, the display driver 200 may be disposed in the sub-region SBA, and may overlap the main region MA in the thickness direction (Z-axis direction) by bending of the sub-region SBA. For example, the display driver 200 may be mounted on the circuit board 300.

The circuit board 300 may be attached to the pad of the display panel 100 by an anisotropic conductive film (ACF). Lead lines of the circuit board 300 may be electrically connected to a pad of the display panel 100. The circuit board 300 may be a flexible printed circuit board, a printed circuit board, or a flexible film such as a chip on film.

A touch driver 400 may be mounted on the circuit board 300. The touch driver 400 may be connected to a touch sensing element of the display panel 100. The touch driver 400 may supply a touch driving signal to a plurality of touch electrodes of the touch sensing element and may sense an amount of change in capacitance between the plurality of touch electrodes. For example, the touch driving signal may be a pulse signal having a predetermined frequency. The touch driver 400 may calculate whether an input is made and input coordinates based on an amount of change in capacitance between the plurality of touch electrodes. The touch driver 400 may be formed of an integrated circuit (IC).

Figure 2:
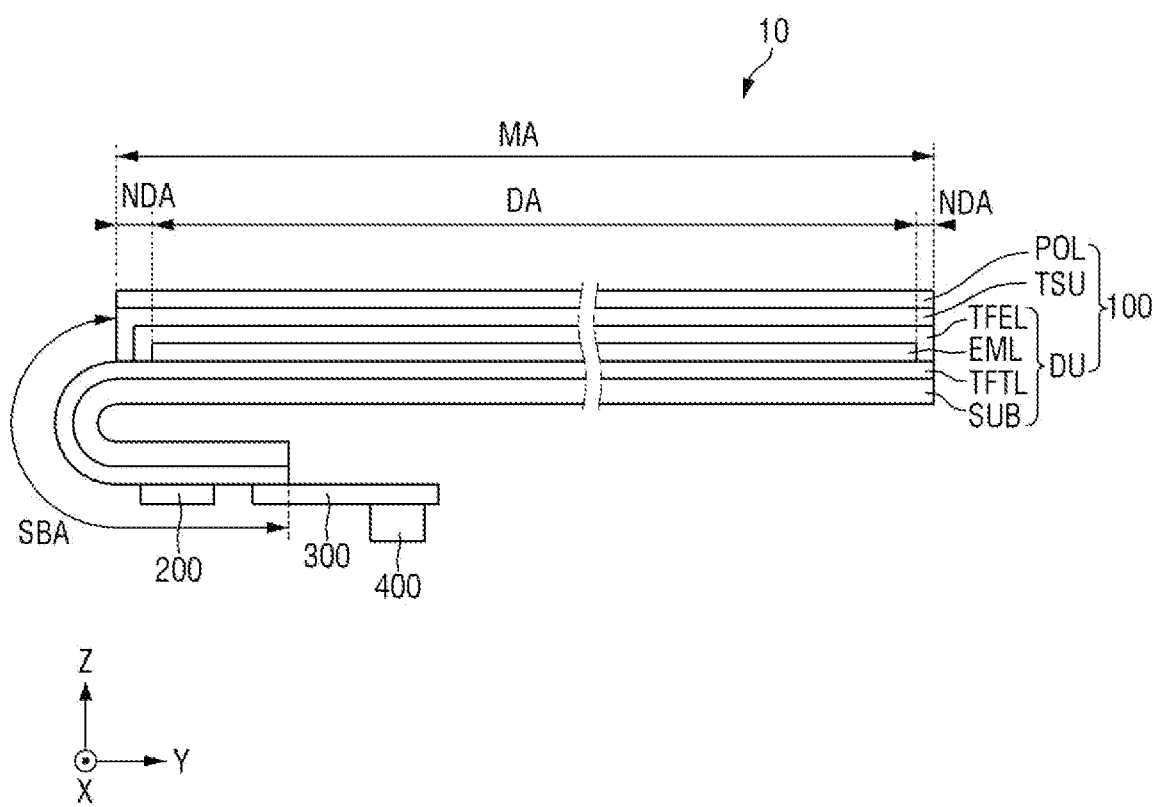
FIG. 2 is a cross-sectional view illustrating a display device according to an embodiment of the present disclosure.

FIG. 2 is a cross-sectional view illustrating a display device according to an embodiment of the present disclosure.

Referring to FIG. 2, the display panel 100 may include a display DU, a touch sensing element TSU, and a polarizing film POL. The display DU may include the substrate SUB, the thin film transistor layer TFTL, the light emitting element layer EML, and the encapsulation layer TFEL.

The substrate SUB may be a base substrate or may otherwise be a base element. The substrate SUB may be a flexible substrate which can be bent, folded or rolled. For example, the substrate SUB may include a glass material or a metal material, but is not necessarily limited thereto. For an example, the substrate SUB may include a polymer resin such as polyimide (PI).

The thin film transistor layer TFTL may be disposed on the substrate SUB. The thin film transistor layer TFTL may include a plurality of thin film transistors constituting a pixel circuit of pixels. The thin film transistor layer TFTL may further include gate lines, data lines, power lines, gate control lines, fan-out lines that connect the display driver 200 to the data lines, and lead lines that connect the display driver 200 to the pad. Each of the thin film transistors may include a semiconductor region, a source electrode, a drain electrode, and a gate electrode. For example, when the gate driver is formed on one side of the non-display area NDA of the display panel 100, the gate driver may include thin film transistors.

The thin film transistor layer TFTL may be disposed in the display area DA, the non-display area NDA, and the sub-region SBA. Thin film transistors, gate lines, data lines, and power lines of each of the pixels of the thin film transistor layer TFTL may be disposed in the display area DA. Gate control lines and fan-out lines of the thin film transistor layer TFTL may be disposed in the non-display area NDA. The lead lines of the thin film transistor layer TFTL may be disposed in the sub-region SBA.

The light emitting element layer EML may be disposed on the thin film transistor layer TFTL. The light emitting element layer EML may include a plurality of light emitting elements in which a first electrode, a light emitting layer, and a second electrode are sequentially stacked to emit light, and a pixel defining layer defining pixels. A plurality of light emitting elements of the light emitting element layer EML may be disposed in the display area DA.

For example, the light emitting layer may be an organic light emitting layer including an organic material. The light emitting layer may include a hole transporting layer, an organic light emitting layer, and an electron transporting layer. When the first electrode receives a predetermined voltage through the thin film transistor of the thin film transistor layer TFTL and the second electrode receives the cathode voltage, holes and electrons may be transferred to the organic light emitting layer through the hole transporting layer and the electron transporting layer, respectively and may be combined with each other to emit light in the organic light emitting layer. For example, the first electrode may be an anode electrode, and the second electrode may be a cathode electrode, but the present disclosure is not necessarily limited thereto.

For example, the plurality of light emitting elements may include a quantum dot light emitting diode including a quantum dot light emitting layer, an inorganic light emitting diode including an inorganic semiconductor, or a micro light emitting diode.

The encapsulation layer TFEL may cover the top surface and the side surface of the light emitting element layer EML and may protect the light emitting element layer EML. The encapsulation layer TFEL may include at least one inorganic layer and at least one organic layer for encapsulating the light emitting element layer EML.

The touch sensing element TSU may be disposed on the encapsulation layer TFEL. The touch sensing element TSU may include a plurality of touch electrodes for sensing a user's touch in a capacitive manner, and touch lines connecting the plurality of touch electrodes to the touch driver 400. For example, the touch sensing element TSU may sense the user's touch by using a mutual capacitance method or a self-capacitance method.

For example, the touch sensing element TSU may be disposed on a separate substrate disposed on the display DU. In this case, the substrate supporting the touch sensing element TSU may be a base element that encapsulates the display DU.

The plurality of touch electrodes of the touch sensing element TSU may be disposed in a touch sensor area overlapping the display area DA. The touch lines of the touch sensing element TSU may be disposed in a touch peripheral area that overlaps the non-display area NDA.

The polarizing film POL may be disposed on the touch sensing element TSU. The polarizing film POL may be attached onto the touch sensing element TSU by an optically clear adhesive (OCA) film or an optically clear resin (OCR). For example, the polarizing film POL may include a phase retardation film such as a linear polarizer plate and a quarter-wave ($\lambda/4$) plate. The phase retardation film and the linear polarizer plate may be sequentially stacked on the touch sensing element TSU.

The sub-region SBA of the display panel 100 may extend from one side of the main region MA. The sub-region SBA may include a flexible material which can be bent, folded or rolled to a noticeable degree without cracking or otherwise sustaining damage. For example, when the sub-region SBA is bent, the sub-region SBA may overlap the main region MA in a thickness direction (Z-axis direction). The sub-region SBA may include the display driver 200 and the pad connected to the circuit board 300.

Figure 3:
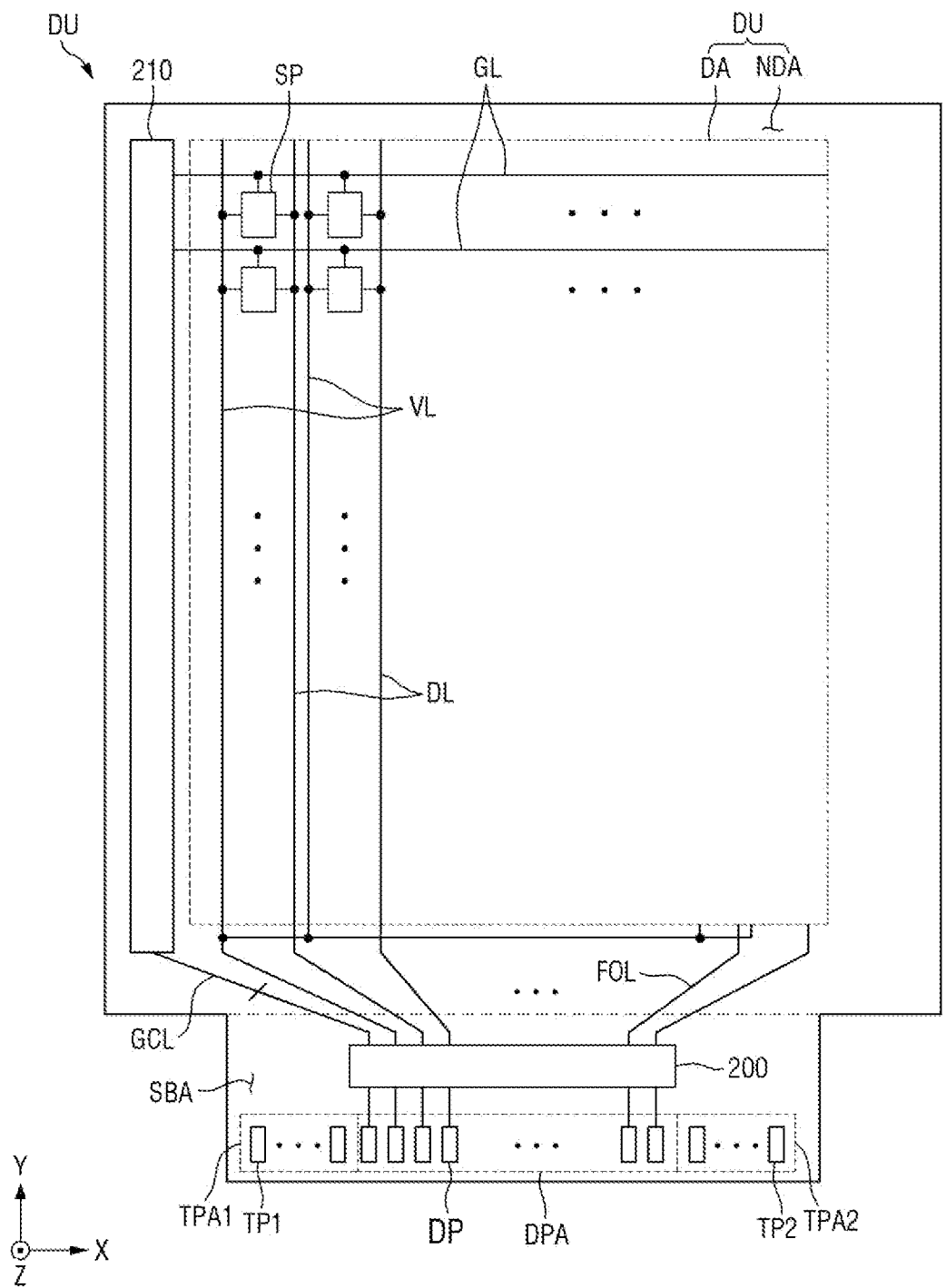
FIG. 3 is a plan view illustrating a display of a display device according to an embodiment of the present disclosure.

FIG. 3 is a plan view illustrating a display of a display device according to an embodiment of the present disclosure.

Referring to FIG. 3, the display DU may include the display area DA and the non-display area NDA.

The display area DA, which is an area for displaying an image, may be defined as the central area of the display panel 100. The display area DA may include a plurality of pixels SP, a plurality of gate lines GL, a plurality of data lines DL, and a plurality of power lines VL. Each of the plurality of pixels SP may be defined as the smallest unit that outputs light.

The plurality of gate lines GL may supply the gate signals received from the gate driver 210 to the plurality of pixels SP. The plurality of gate lines GL may extend in the X-axis direction and may be spaced apart from each other in the Y-axis direction that crosses the X-axis direction.

The plurality of data lines DL may supply the data voltages received from the display driver 200 to the plurality of pixels SP. The plurality of data lines DL may extend in the Y-axis direction and may be spaced apart from each other in the X-axis direction.

The plurality of power lines VL may supply the power voltage received from the display driver 200 to the plurality of pixels SP. Here, the power voltage may be a driving voltage, an initialization voltage, a reference voltage, and/or a low potential voltage. The plurality of power lines VL may extend in the Y-axis direction and may be spaced apart from each other in the X-axis direction.

The non-display area NDA may at least partially surround the display area DA. The non-display area NDA may include a gate driver 210, fan-out lines FOL, and gate control lines GCL. The gate driver 210 may generate a plurality of gate signals based on the gate control signal and may sequentially supply the plurality of gate signals to the plurality of gate lines GL according to a set order.

The fan-out lines FOL may extend from the display driver 200 to the display area DA. The fan-out lines FOL may supply the data voltage received from the display driver 200 to the plurality of data lines DL.

The gate control line GCL may extend from the display driver 200 to the gate driver 210. The gate control line GCL may supply the gate control signal received from the display driver 200 to the gate driver 210.

The sub-region SBA may include the display driver 200, a display pad area DPA, and first and second touch pad areas TPA1 and TPA2.

The display driver 200 may output signals and voltages for driving the display panel 100 to the fan-out lines FOL. The display driver 200 may supply a data voltage to the data line DL through the fan-out lines FOL. The data voltage may be supplied to the plurality of pixels SP to determine the luminance of the plurality of pixels SP. The display driver 200 may supply the gate control signal to the gate driver 210 through the gate control line GCL.

The display pad area DPA, the first touch pad area TPA1, and the second touch pad area TPA2 may be disposed at the edge of the sub-region SBA. The display pad area DPA, the first touch pad area TPA1, and the second touch pad area TPA2 may be electrically connected to the circuit board 300 by using a low-resistance and high-reliability material such as an anisotropic conductive film or a self assembly anisotropic conductive paste (SAP).

The display pad area DPA may include a plurality of display pads DP. The plurality of display pads DP may be connected to a graphic system through the circuit board 300. The plurality of display pads DP may be connected to the circuit board 300 to receive digital video data and may supply the digital video data to the display driver 200.

Figure 4:
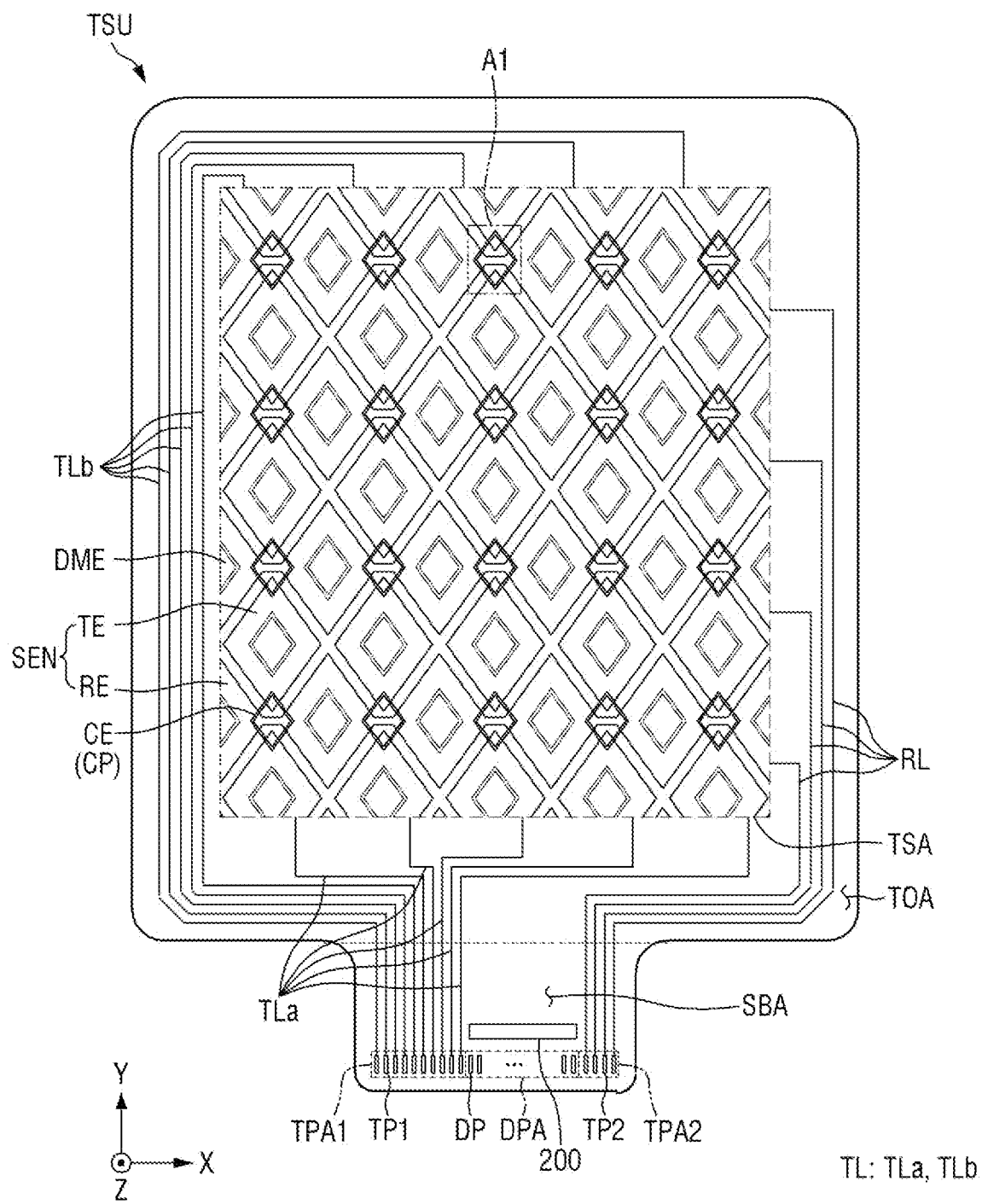
FIG. 4 is a plan view illustrating a touch sensing element of a display device according to an embodiment of the present disclosure.

FIG. 4 is a plan view illustrating a touch sensing element of a display device according to an embodiment of the present disclosure.

Referring to FIG. 4, the touch sensing element TSU may include a touch sensor area TSA for sensing a user's touch, and a touch peripheral area TOA disposed around the touch sensor area TSA. The touch sensor area TSA may overlap the display area DA of the display DU, and the touch peripheral area TOA may overlap the non-display area NDA of the display DU.

The touch sensor area TSA may include a plurality of touch electrodes SEN and a plurality of dummy electrodes DME. The plurality of touch electrodes SEN may form mutual capacitance or self-capacitance to sense a touch of an object or a person. The plurality of touch electrodes SEN may include a plurality of driving electrodes TE and a plurality of sensing electrodes RE.

The plurality of driving electrodes TE may be arranged in the X-axis direction and the Y-axis direction. The plurality of driving electrodes TE may be spaced apart from each other in the X-axis direction and the Y-axis direction. The driving electrodes TE adjacent in the Y-axis direction may be electrically connected through a bridge electrode CE.

The plurality of driving electrodes TE may be connected to a first touch pad TP1 through a driving line TL. The driving line TL may include a lower driving line TLa and an upper driving line TLb. For example, the driving electrodes TE disposed under the touch sensor area TSA may be connected to the first touch pad TP1 through the lower driving line TLa, and the driving electrodes TE disposed on the upper side of the touch sensor area TSA may be connected to the first touch pad TP1 through the upper driving line TLb. The lower driving line TLa may extend to the first touch pad TP1 through the lower side of the touch peripheral area TOA. The upper driving line TLb may extend to the first touch pad TP1 through the upper side, the left side, and the lower side of the touch peripheral area TOA. The first touch pad TP1 may be connected to the touch driver 400 through the circuit board 300.

The touch sensing TSU may further include a bridge electrode CE that connects the driving electrodes TE, and a code pattern CP determined by the planar shape of the bridge electrode CE. The bridge electrode CE may have a closed loop shape but is not necessarily limited thereto. Since the display device 10 includes the code pattern CP having a closed loop shape, the identification sensitivity of the code pattern CP may be increased. For example, the bridge electrode CE may be formed in a mesh structure and a net structure in a plan view. The driving electrodes TE adjacent to each other in the Y-axis direction may be connected by a plurality of bridge electrodes CE. The driving electrodes TE adjacent to each other may be connected by the bridge electrode CE having a closed loop shape, but the number of the bridge electrodes CE is not necessarily limited thereto.

The bridge electrode CE may be disposed on a different layer from that of the plurality of driving electrodes TE and the plurality of sensing electrodes RE. The sensing electrodes RE adjacent to each other in the X-axis direction may be electrically connected through a connection portion disposed on the same layer as the plurality of driving electrodes TE or the plurality of sensing electrodes RE. The driving electrodes TE adjacent in the Y-axis direction may be electrically connected through the bridge electrode CE disposed on a different layer from the plurality of driving electrodes TE or the plurality of sensing electrodes RE. Accordingly, although the bridge electrode CE overlaps the plurality of sensing electrodes RE in the Z-axis direction, the plurality of driving electrodes TE and the plurality of sensing electrodes RE may be insulated from each other. Mutual capacitance may be formed between the driving electrode TE and the sensing electrode RE.

The plurality of sensing electrodes RE may extend in the X-axis direction and may be spaced apart from each other in the Y-axis direction. The plurality of sensing electrodes RE may be arranged in the X-axis direction and the Y-axis direction, and the sensing electrodes RE adjacent in the X-axis direction may be electrically connected through a connection portion.

The plurality of sensing electrodes RE may be connected to the second touch pad TP2 through a sensing line RL. For example, the sensing electrodes RE disposed on the right side of the touch sensor area TSA may be connected to the second touch pad TP2 through the sensing line RL. The sensing line RL may extend to the second touch pad TP2 through the right side and the lower side of the touch peripheral area TOA. The second touch pad TP2 may be connected to the touch driver 400 through the circuit board 300.

Each of the plurality of dummy electrodes DME may be at least partially surrounded by the driving electrode TE or the sensing electrode RE. Each of the dummy electrodes DME may be insulated by being spaced apart from the driving electrode TE or the sensing electrode RE. Accordingly, the dummy electrode DME may be electrically floated.

The display pad area DPA, the first touch pad area TPA1, and the second touch pad area TPA2 may be disposed at the edge of the sub-region SBA. The display pad area DPA, the first touch pad area TPA1, and the second touch pad area TPA2 may be electrically connected to the circuit board 300 by using a low-resistance and high-reliability material such as an anisotropic conductive film or a self assembly anisotropic conductive paste (SAP).

The first touch pad area TPA1 may be disposed on one side of the display pad area DPA, and may include a plurality of first touch pads TP1. The plurality of first touch pads TP1 may be electrically connected to the touch driver 400 disposed on the circuit board 300. The plurality of first touch pads TP1 may supply a touch driving signal to the plurality of driving electrodes TE through a plurality of driving lines TL.

The second touch pad area TPA2 may be disposed on the other side of the display pad area DPA, and may include a plurality of second touch pads TP2. The plurality of second touch pads TP2 may be electrically connected to the touch driver 400 disposed on the circuit board 300. The touch driver 400 may receive a touch sensing signal through a plurality of sensing lines RL connected to the plurality of second touch pads TP2, and may sense a change in mutual capacitance between the driving electrode TE and the sensing electrode RE.

As an example, the touch driver 400 may supply a touch driving signal to each of the plurality of driving electrodes TE and the plurality of sensing electrodes RE, and may receive a touch sensing signal from each of the plurality of driving electrodes TE and the plurality of sensing electrodes RE. The touch driver 400 may sense an amount of change in electric charge of each of the plurality of driving electrodes TE and the plurality of sensing electrodes RE based on the touch sensing signal.

Figure 5:
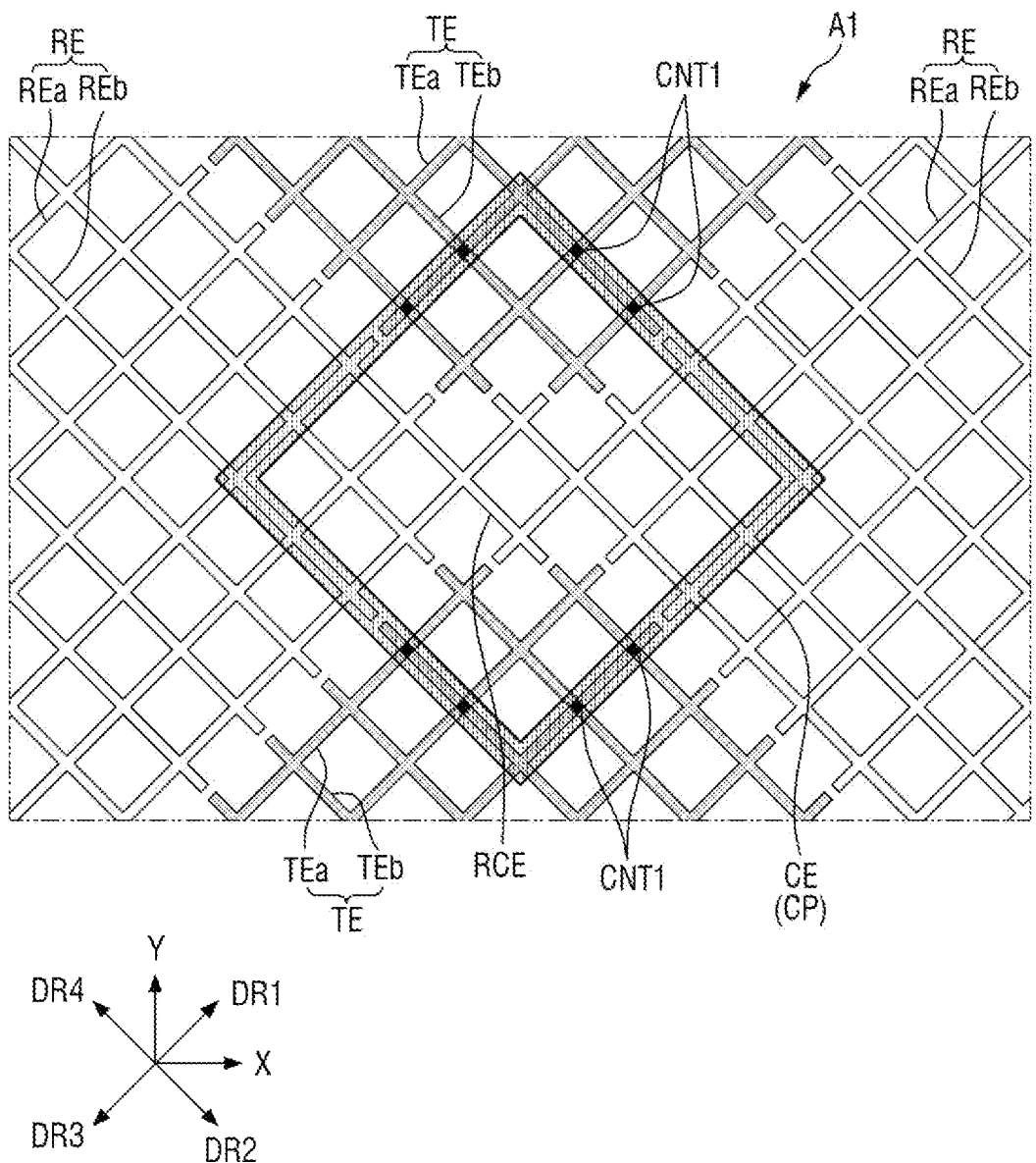
FIG. 5 is an enlarged view of area A1 of FIG. 4.
Figure 6:
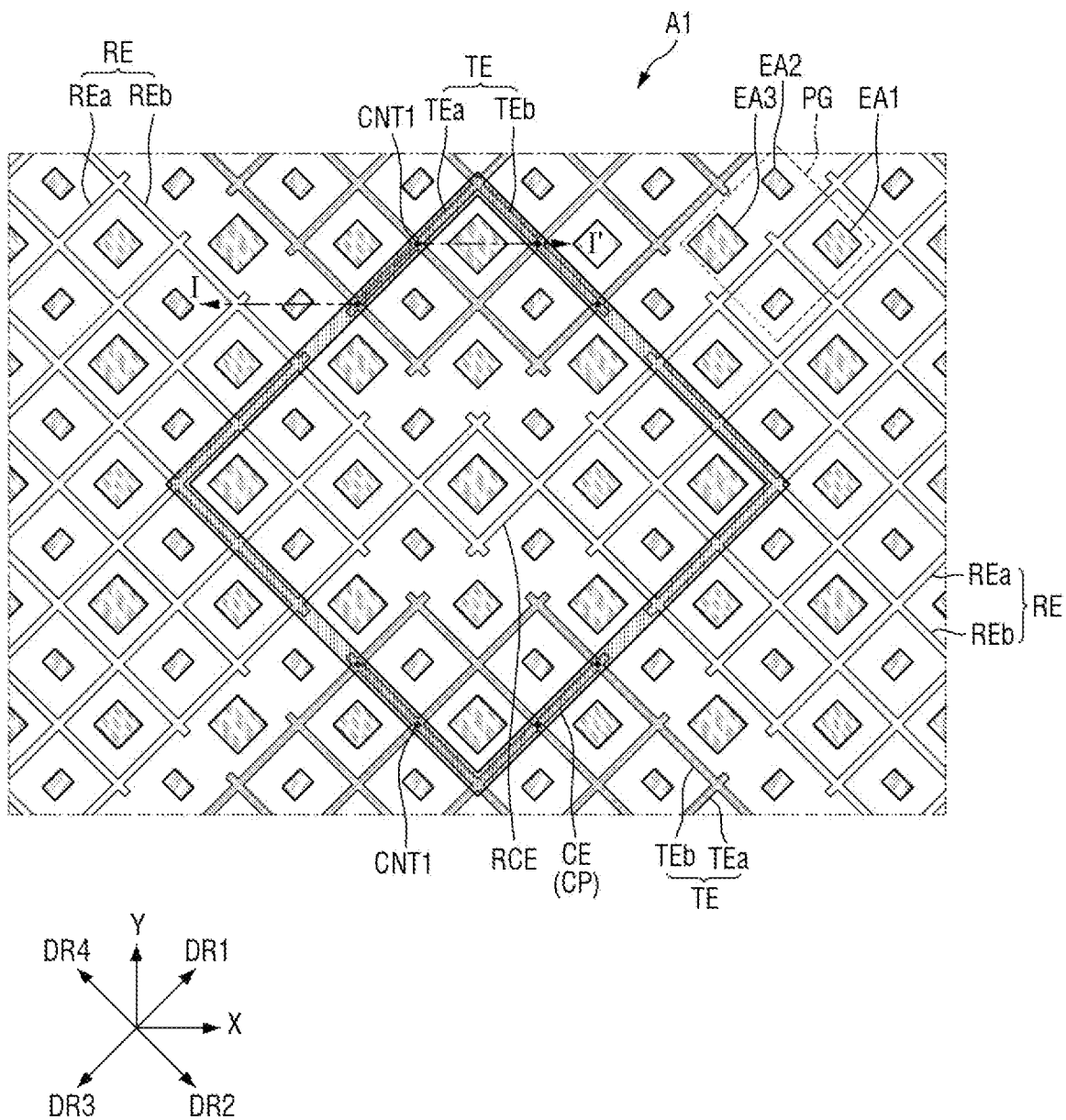
FIG. 6 is an enlarged view illustrating a part of a display device according to an embodiment of the present disclosure.

FIG. 5 is an enlarged view of area A1 of FIG. 4, and FIG. 6 is an enlarged view illustrating a part of a display device according to an embodiment of the present disclosure.

Referring to FIGS. 5 and 6, the plurality of driving electrodes TE, the plurality of sensing electrodes RE, and the plurality of dummy electrodes DME may be disposed on the same layer and may be spaced apart from each other.

The plurality of driving electrodes TE may be arranged in the X-axis direction and the Y-axis direction. The plurality of driving electrodes TE may be spaced apart from each other in the X-axis direction and the Y-axis direction. The driving electrodes TE adjacent in the Y-axis direction may be electrically connected through a bridge electrode CE.

The plurality of sensing electrodes RE may extend in the X-axis direction and may be spaced apart from each other in the Y-axis direction. The plurality of sensing electrodes RE may be arranged in the X-axis direction and the Y-axis direction, and the sensing electrodes RE adjacent in the X-axis direction may be electrically connected through a connection portion RCE. For example, the connection portion RCE of the sensing electrodes RE may be disposed within the shortest distance between the driving electrodes TE adjacent to each other.

The plurality of bridge electrodes CE may be disposed on a different layer from the driving electrode TE and the sensing electrode RE. The bridge electrode CE may have a closed loop shape but is not necessarily limited thereto. For example, one line of the bridge electrode CE may be connected to the driving electrode TE disposed on one side through a first contact hole CNT1 and extend in a third direction DR3. The other side of the bridge electrode CE may be bent from one side of the bridge electrode CE in an area overlapping the sensing electrode RE to extend in a second direction DR2 and may be connected to the driving electrode TE disposed on the other side through the first contact hole CNT1. Hereinafter, a first direction DR1 may be a direction between the X-axis direction and the Y-axis direction, the second direction DR2 may be a direction between a direction opposite to the Y-axis and the X-axis direction, the third direction DR3 may be a direction opposite to the first direction DR1, and the fourth direction DR4 may be a direction opposite to the second direction DR2. Accordingly, the bridge electrode CE may connect the driving electrodes TE adjacent in the Y-axis direction to each other.

When a camera captures an image of the touch sensing element TSU using infrared or ultraviolet light, the bridge electrode CE may be distinguished from the plurality of touch electrodes SEN. Accordingly, since the code pattern CP is photographed by a camera that uses infrared or ultraviolet light, the image quality of the display device 10 might not be deteriorated. The plurality of code patterns CP may be disposed over the entire touch sensor area TSA of the touch sensing element TSU, and each of the plurality of code patterns CP may have position information according to a specific criterion. The code pattern CP may be photographed by a camera approaching the front of the display device 10 and may be identified through the captured video or image. At least one code pattern CP or a combination of the code patterns CP may correspond to a preset data code value. For example, the code pattern CP disposed at a specific position may correspond to a data code designated at the corresponding position.

The display device 10 may include the plurality of code patterns CP determined by the planar shape of the bridge electrode CE, thereby receiving an input from an input device such as an input stylus (which may be called a "pen"). Here, the input pen may be a smart stylus, an electromagnetic stylus, or an active stylus, but is not necessarily limited thereto. At least one code pattern CP or a combination of the code patterns CP may have position information according to a specific criterion, and may correspond to a preset data code one-to-one. Accordingly, the display device 10 may receive coordinate data generated without complex calculation and correction by using the data code, thereby performing the corresponding function according to the correct input coordinates, reducing cost and power consumption, and simplifying a driving process. In addition, the display device 10 may include the code pattern CP incorporated in the touch sensing element TSU, and thus might not necessarily be limited in size and may be applied to all electronic devices having a touch function.

For example, the plurality of driving electrodes TE, the plurality of sensing electrodes RE, and the plurality of dummy electrodes DME may be formed in a planar mesh structure or a mesh structure. The plurality of driving electrodes TE, the plurality of sensing electrodes RE, and the plurality of dummy electrodes DME may at least partially surround each of first to third emission areas EA1, EA2, and EA3 of a pixel group PG in a plan view. Accordingly, the plurality of driving electrodes TE, the plurality of sensing electrodes RE, and the plurality of dummy electrodes DME might not overlap first to third emission areas EA1, EA2, and EA3. The bridge electrode CE or the code pattern CP may also not overlap the first to third emission areas EA1, EA2, and EA3. Accordingly, the display device 10 may prevent the luminance of light emitted from the first to third emission areas EA1, EA2, and EA3 from being reduced by the touch sensing element TSU.

Each of the plurality of driving electrodes TE may include a first portion TEa extending in the first direction DR1 and a second portion TEb extending in the second direction DR2. Each of the plurality of sensing electrodes RE may include a first portion REa extending in the first direction DR1 and a second portion REb extending in the second direction DR2.

The plurality of pixels may include first to third sub-pixels, and the first to third sub-pixels may include the first to third emission areas EA1, EA2, and EA3. For example, the first emission area EA1 may emit light of a first color (e.g., red light), the second emission area EA2 may emit light of a second color (e.g., green light), and the third emission area EA3 may emit light of a third color (e.g., blue light), but the present invention is not necessarily limited thereto.

One pixel group PG may represent white gray scale by including one first emission area EA1, two second emission areas EA2, and one third emission area EA3, but the configuration of the pixel group PG is not necessarily limited thereto. The white gray scale may be represented by a combination of light emitted from one first emission area EA1, light emitted from two second emission areas EA2, and light emitted from one third emission area EA3.

Figure 7:
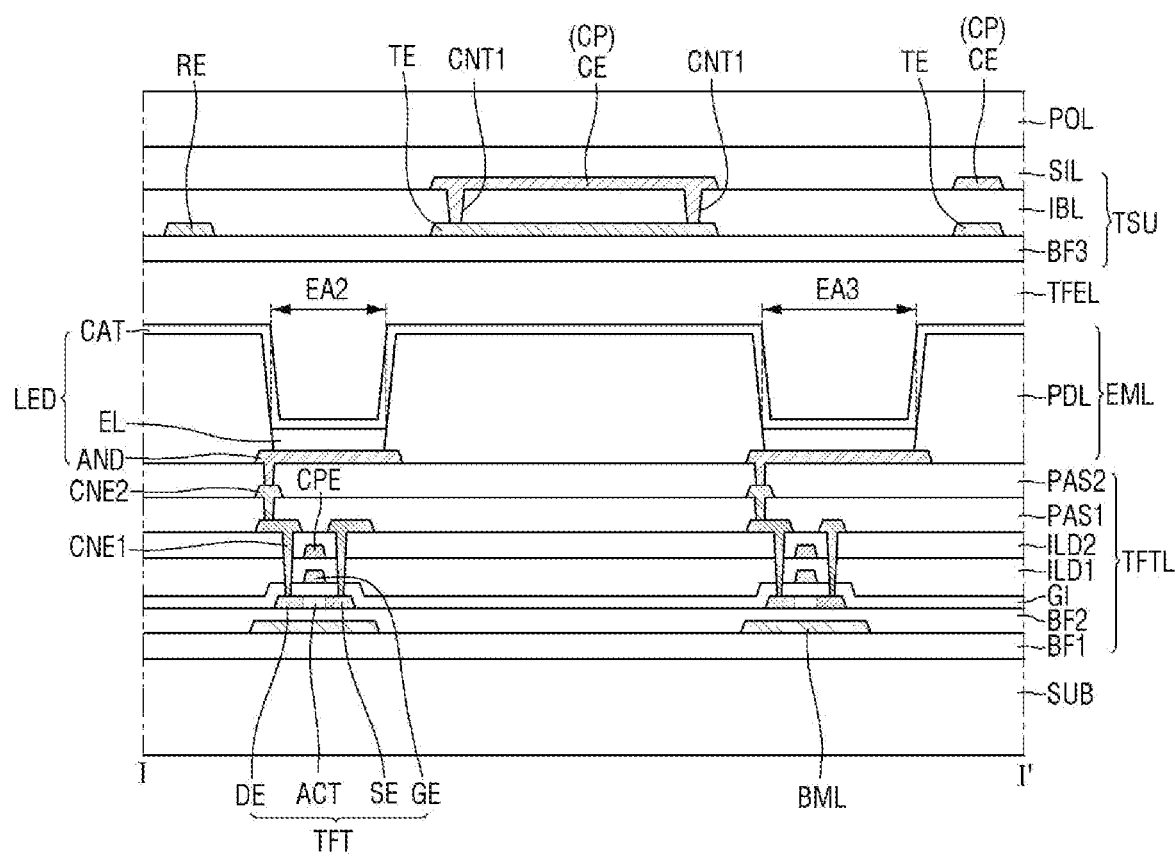
FIG. 7 is a cross-sectional view taken along line I-I' of FIG. 6.

FIG. 7 is a cross-sectional view taken along line I-I' of FIG. 6.

Referring to FIG. 7, the display panel 100 may include a display DU, a touch sensing element TSU, and a polarizing film POL. The display DU may include the substrate SUB, the thin film transistor layer TFTL, the light emitting element layer EML, and the encapsulation layer TFEL.

The substrate SUB may be a base substrate or a base element. The substrate SUB may be a flexible substrate which can be bent, folded or rolled to a noticeable extent without cracking or otherwise sustaining damage. For example, the substrate SUB may include a glass material or a metal material, but is not necessarily limited thereto. For example, the substrate SUB may include a polymer resin such as polyimide (PI).

The thin film transistor layer TFTL may include a first buffer layer BF1, a light blocking layer BML, a second buffer layer BF2, a thin film transistor TFT, a gate insulating layer GI, a first interlayer insulating layer ILD1, a capacitor electrode CPE, a second interlayer insulating layer ILD2, a first connection electrode CNE1, a first passivation layer PAS1, a second connection electrode CNE2, and a second passivation layer PAS2.

The first buffer layer BF1 may be disposed on the substrate SUB. The first buffer layer BF1 may include an inorganic layer capable of preventing penetration of air or moisture. For example, the first buffer layer BF1 may include a plurality of inorganic layers alternately stacked.

A light blocking layer BML may be disposed on the first buffer layer BF1. For example, the light blocking layer BML may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof. As an example, the light blocking layer BML may be an organic layer including a black pigment.

The second buffer layer BF2 may cover the first buffer layer BF1 and the light blocking layer BML. The second buffer layer BF2 may include an inorganic layer capable of preventing penetration of air or moisture. For example, the second buffer layer BF2 may include a plurality of inorganic layers alternately stacked.

The thin film transistor TFT may be disposed on the second buffer layer BF2 and may constitute a pixel circuit of each of a plurality of pixels. For example, the thin film transistor TFT may be a switching transistor or a driving transistor of the pixel circuit. The thin film transistor TFT may include a semiconductor region ACT, a source electrode SE, a drain electrode DE, and a gate electrode GE.

The semiconductor region ACT, the source electrode SE, and the drain electrode DE may be disposed on the second buffer layer BF2. The semiconductor region ACT, the source electrode SE, and the drain electrode DE may overlap the light blocking layer BML in the thickness direction. The semiconductor region ACT may overlap the gate electrode GE in the thickness direction and may be insulated from the gate electrode GE by the gate insulating layer GI. The source electrode SE and the drain electrode DE may be provided by making a material of the semiconductor region ACT conductive.

The gate electrode GE may be disposed on the gate insulating layer GI. The gate electrode GE may overlap the semiconductor region ACT with the gate insulating layer GI interposed therebetween.

The gate insulating layer GI may be disposed on the semiconductor region ACT, the source electrode SE, and the drain electrode DE. For example, the gate insulating layer GI may cover the semiconductor region ACT, the source electrode SE, the drain electrode DE, and the second buffer layer BF2, and may insulate the semiconductor region ACT from the gate electrode GE. The gate insulating layer GI may include a contact hole through which the first connection electrode CNE1 passes.

The first interlayer insulating layer ILD1 may cover the gate electrode GE and the gate insulating layer GI. The first interlayer insulating layer ILD1 may include a contact hole through which the first connection electrode CNE1 passes. The contact hole of the first interlayer insulating layer ILD1 may be connected to the contact hole of the gate insulating layer GI and the contact hole of the second interlayer insulating layer ILD2.

The capacitor electrode CPE may be disposed on the first interlayer insulating layer ILD1. The capacitor electrode CPE may overlap the gate electrode GE in the thickness direction. A capacitance may form between the capacitor electrode CPE and the gate electrode GE.

The second interlayer insulating layer ILD2 may cover the capacitor electrode CPE and the first interlayer insulating layer ILD1. The second interlayer insulating layer ILD2 may include a contact hole through which the first connection electrode CNE1 passes. The contact hole of the second interlayer insulating layer ILD2 may be connected to the contact hole of the first interlayer insulating layer ILD1 and the contact hole of the gate insulating layer GI.

The first connection electrode CNE1 may be disposed on the second interlayer insulating layer ILD2. The first connection electrode CNE1 may connect the drain electrode DE of the thin film transistor TFT to the second connection electrode CNE2. The first connection electrode CNE1 may be inserted into a contact hole provided in the second interlayer insulating layer ILD2, the first interlayer insulating layer ILD1, and the gate insulating layer GI to be in contact with (e.g., in direct contact with) the drain electrode DE of the thin film transistor TFT.

The first passivation layer PAS1 may cover the first connection electrode CNE1 and the second interlayer insulating layer ILD2. The first passivation layer PAS1 may protect the thin film transistor TFT. The first passivation layer PAS1 may include a contact hole through which the second connection electrode CNE2 passes.

The second connection electrode CNE2 may be disposed on the first passivation layer PAS1. The second connection electrode CNE2 may connect the first connection electrode CNE1 and a pixel electrode AND of the light emitting element LED. The second connection electrode CNE2 may be inserted into a contact hole provided in the first passivation layer PAS1 to be in contact with the first connection electrode CNE1.

The second passivation layer PAS2 may cover the second connection electrode CNE2 and the first passivation layer PAS1. The second passivation layer PAS2 may include a contact hole through which the pixel electrode AND of the light emitting element LED passes.

The light emitting element layer EML may be disposed on the thin film transistor layer TFTL. The light emitting element layer EML may include the light emitting element LED and a pixel defining layer PDL. The light emitting element LED may include the pixel electrode AND, a light emitting layer EL, and a common electrode CAT.

The pixel electrode AND may be disposed on the second passivation layer PAS2. The pixel electrode AND may overlap one of the first to third emission areas EA1, EA2, and EA3 defined by the pixel defining layer PDL. The pixel electrode AND may be connected to the drain electrode DE of the thin film transistor TFT through the first and second connection electrodes CNE1 and CNE2.

The light emitting layer EL may be disposed on the pixel electrode AND. For example, the light emitting layer EL may be an organic light emitting layer made of an organic material but the present invention is not necessarily limited thereto. In the case of employing the organic light emitting layer as the light emitting layer EL, the thin film transistor TFT applies a predetermined voltage to the pixel electrode AND of the light emitting element LED, and if the common electrode CAT of the light emitting element LED receives a common voltage or a cathode voltage, the holes and electrons can move to the light emitting layer EL through the hole transport layer and the electron transport layer and combine to produce light to be emitted by the light emitting layer EL.

The common electrode CAT may be arranged on the light emitting layer EL. For example, the common electrode CAT may be made in the form of an electrode common to all of the pixels rather than specific to each of the pixels. The common electrode CAT may be disposed on the light emitting layer EL in the first to third emission areas EA1, EA2, and EA3, and may be disposed on the pixel defining layer PDL in an area other than the first to third emission areas EA1, EA2, and EA3.

The common electrode CAT may receive the common voltage or a low potential voltage. When the pixel electrode AND receives a voltage corresponding to a data voltage and the common electrode CAT receives the low potential voltage, a potential difference is formed between the pixel electrode AND and the common electrode CAT, so that the light emitting layer EL may emit light.

The pixel defining layer PDL may define the first to third emission areas EA1, EA2, and EA3. The pixel defining layer PDL may separate and insulate the pixel electrode AND of each of the plurality of light emitting elements ED.

The encapsulation layer TFEL may be disposed on the common electrode CAT to cover the plurality of light emitting elements LED. The encapsulation layer TFEL may include at least one inorganic layer to prevent oxygen or moisture from penetrating into the light emitting element layer EML. The encapsulation layer TFEL may include at least one organic layer to protect the light emitting element layer EML from foreign matters such as dust.

The touch sensing element TSU may be disposed on the encapsulation layer TFEL. The touch sensing element TSU may include a third buffer layer BF3, the driving electrode TE, the sensing electrode RE, a wavelength absorption layer IBL, the bridge electrode CE, and an insulating layer SIL.

The third buffer layer BF3 may be disposed on the encapsulation layer TFEL. The third buffer layer BF3 may have an insulating and optical function. The third buffer layer BF3 may include at least one inorganic layer. Optionally, the third buffer layer BF3 may be omitted.

The driving electrode TE and the sensing electrode RE may be disposed on the third buffer layer BF3. Each of the driving electrode TE and the sensing electrode RE might not overlap the first to third emission areas EA1, EA2, and EA3. Each of the driving electrode TE and the sensing electrode RE may be formed of a single layer containing molybdenum (Mo), titanium (Ti), copper (Cu), aluminum (Al), or indium tin oxide (ITO), or may have a stacked structure (Ti/Al/Ti) of aluminum and titanium, a stacked structure (ITO/Al/ITO) of aluminum and ITO, an Ag—Pd—Cu (APC) alloy, or a stacked structure (ITO/APC/ITO) of APC alloy and ITO.

The wavelength absorption layer IBL may be disposed on the driving electrode TE, the sensing electrode RE, and the third buffer layer BF3. The wavelength absorption layer IBL may transmit visible light and absorb light of a specific wavelength. The wavelength absorption layer IBL may include an infrared absorbing material or an ultraviolet absorbing material. For example, the wavelength absorption layer IBL may be an inorganic layer including an inorganic black pigment. The wavelength absorption layer IBL may be formed on the plurality of touch electrodes SEN through a chemical vapor deposition (CVD) process. In the wavelength absorption layer IBL, the absorbance of a specific wavelength may be adjusted depending on the content of the inorganic black pigment. The inorganic black pigment may be carbon black but is not necessarily limited thereto. The wavelength absorption layer IBL may include silicon nitride (SiNx), silicon oxide (SiOx), or silicon carbide (SiC).

For example, the wavelength absorption layer IBL may be an organic layer including an organic black pigment. The wavelength absorption layer IBL may be formed on the plurality of touch electrodes SEN through a coating process or an inkjet process. In the wavelength absorption layer IBL, the absorbance of a specific wavelength may be adjusted depending on the content of the organic black pigment. The organic black pigment may include lactam black, perylene black, and/or aniline black, but the present invention is not necessarily limited thereto.

The bridge electrode CE may be disposed on the wavelength absorption layer IBL. The bridge electrode CE may be disposed on a different layer from the driving electrode TE and the sensing electrode RE to connect the driving electrodes TE adjacent in the Y-axis direction to each other. The bridge electrode CE may reflect light of a specific wavelength. The bridge electrode CE may include an infrared reflective material or an ultraviolet reflective material.

Accordingly, when the camera captures an image of the touch sensing element TSU using infrared or ultraviolet light, the bridge electrode CE disposed on the wavelength absorption layer IBL may be distinguished from the touch electrode SEN disposed under the wavelength absorption layer IBL. Since the code pattern CP is photographed by a camera that uses infrared or ultraviolet light, the image quality of the display device 10 might not be deteriorated.

The insulating layer SIL may be disposed on the bridge electrode CE and the wavelength absorption layer IBL. The insulating layer SIL may have an insulating and optical function. For example, the insulating layer SIL may be an inorganic layer containing a silicon nitride layer, a silicon oxynitride layer, a silicon oxide layer, a titanium oxide layer, and/or an aluminum oxide layer.

The polarizing film POL may be disposed on the touch sensing element TSU. The polarizing film POL may be attached onto the touch sensing element TSU by using an optically clear adhesive (OCA) film or an optically clear resin (OCR). For example, the polarizing film POL may include a phase retardation film such as a linear polarizer plate and a quarter-wave ($\lambda/4$) plate. The phase retardation film and the linear polarizer plate may be sequentially stacked on the touch sensing element TSU.

Figure 8:
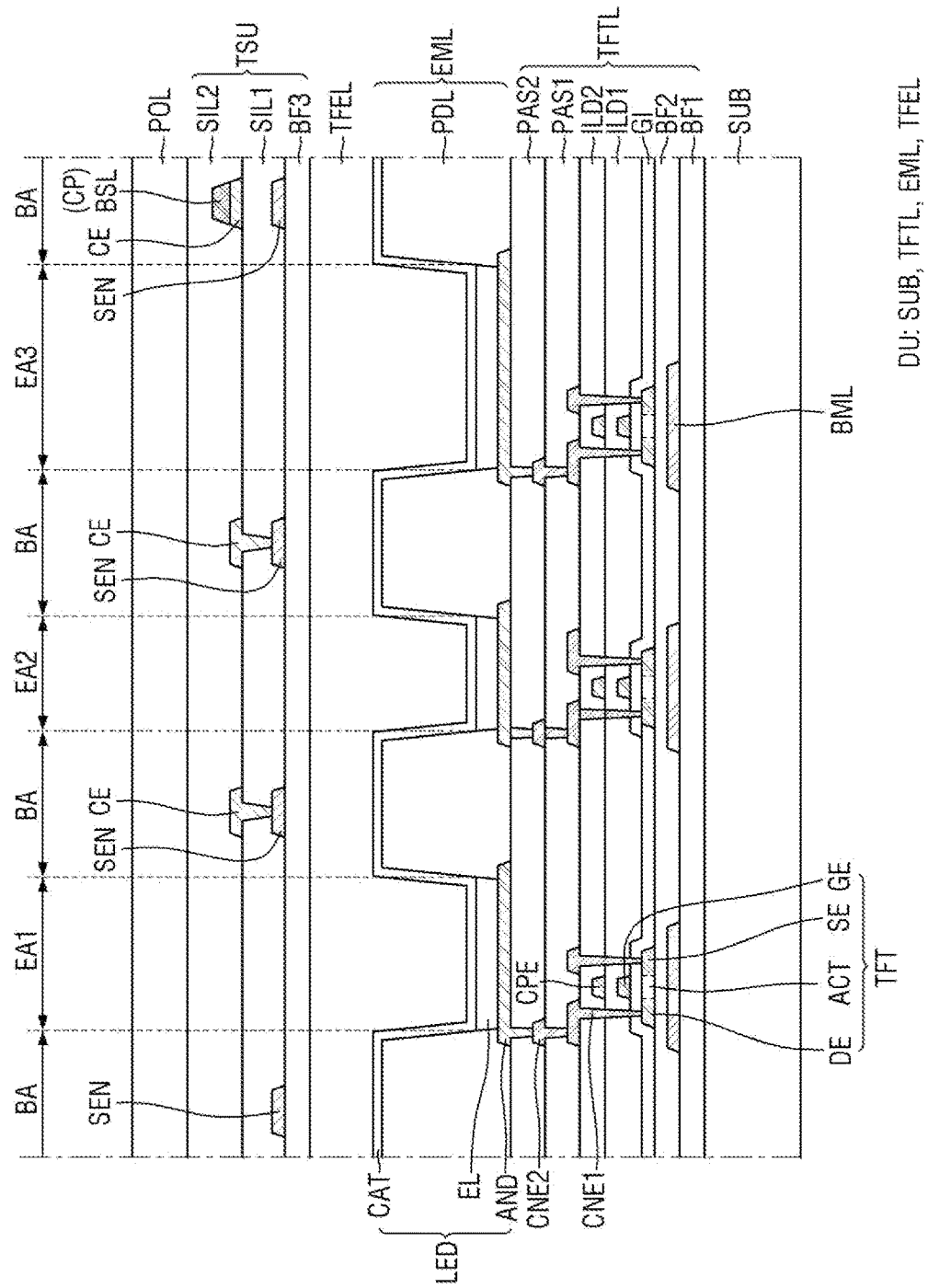
FIG. 8 is a cross-sectional view showing a display device according to an embodiment of the present disclosure.

FIG. 8 is a cross-sectional view showing a display device according to an embodiment of the present disclosure. The display device of FIG. 8 further includes a light blocking pattern BSL without including the wavelength absorption layer IBL of the display device of FIG. 7, and to the extent that a detailed description of an embodiment has been omitted, it may be assumed that the element is at least similar to a corresponding element that has been described in detail elsewhere within the instant disclosure.

Referring to FIG. 8, the touch sensing element TSU may be disposed on the encapsulation layer TFEL. The touch sensing element TSU may include a third buffer layer BF3, a plurality of touch electrodes SEN, a first insulating layer SIL1 a bridge electrode CE, a light blocking pattern BSL, and a second insulating layer SIL2.

The plurality of touch electrodes SEN may be disposed on the third buffer layer BF3. The plurality of touch electrodes SEN might not overlap the first to third emission areas EA1, EA2, and EA3. The touch electrode SEN may be formed of a single layer containing molybdenum (Mo), titanium (Ti), copper (Cu), aluminum (Al), or indium tin oxide (ITO), or may have a stacked structure (Ti/Al/Ti) of aluminum and titanium, a stacked structure (ITO/Al/ITO) of aluminum and ITO, an Ag—Pd—Cu (APC) alloy, or a stacked structure (ITO/APC/ITO) of APC alloy and ITO.

The first insulating layer SIL1 may be disposed on the plurality of touch electrodes SEN and the third buffer layer BF3. The first insulating layer SIL1 may have an insulating and optical function. The first insulating layer SIL1 might not absorb light of a specific wavelength or may absorb a relatively small amount of light of a specific wavelength. For example, the first insulating layer SIL1 may transmit infrared or ultraviolet light.

The bridge electrode CE may be disposed on the first insulating layer SIL1. The bridge electrode CE may be disposed on a different layer from that of the plurality of touch electrodes SEN to connect the driving electrodes TE adjacent in the Y-axis direction to each other. The bridge electrode CE may reflect light of a specific wavelength. The bridge electrode CE may include an infrared reflective material or an ultraviolet reflective material.

The light blocking pattern BSL may be disposed on at least a part of the bridge electrode CE. The light blocking pattern BSL may absorb light of a specific wavelength, and the bridge electrode CE or the touch electrode SEN that does not overlap the light blocking pattern BSL may reflect light of a specific wavelength. The light blocking pattern BSL may include an infrared absorbing material or an ultraviolet absorbing material. For example, the light blocking pattern BSL may include an inorganic black pigment or an organic black pigment. The inorganic black pigment may be carbon black, and the organic black pigment may include lactam black, perylene black, and/or aniline black, but they are not necessarily limited thereto.

Accordingly, when the camera captures an image of the touch sensing element TSU using infrared or ultraviolet light, the light blocking pattern BSL may be distinguished from the bridge electrode CE or the touch electrode SEN. The touch sensing element TSU may further include the code pattern CP determined by the planar shape of the light blocking pattern BSL. Since the code pattern CP is photographed by a camera that uses infrared or ultraviolet light, the image quality of the display device 10 might not be deteriorated.

Since the display device 10 includes the code pattern CP having a closed loop shape, the identification sensitivity of the code pattern CP may be increased. One code pattern CP may at least partially surround one or more of the first to third emission areas EA1, EA2, and EA3 in a plan view. The code pattern CP might not overlap the first to third emission areas EA1, EA2, and EA3. Accordingly, the display device 10 may prevent the luminance of light emitted from the first to third emission areas EA1, EA2, and EA3 from being reduced by the light blocking pattern BSL.

The plurality of code patterns CP may be disposed over the entire touch sensor area TSA of the touch sensing element TSU, and each of the plurality of code patterns CP may have position information according to a specific criterion. The code pattern CP may be photographed by a camera approaching the front of the display device 10 and may be identified through the captured video or image. At least one code pattern CP or a combination of the code patterns CP may correspond to a preset data code value. For example, the code pattern CP disposed at a specific position may correspond to a data code designated at the corresponding position.

The display device 10 may include the plurality of code patterns CP determined by the planar shape of the light blocking pattern BSL, thereby receiving an input from an input device such as an input stylus. At least one code pattern CP or a combination of the code patterns CP may have position information according to a specific criterion and may correspond to a preset data code one-to-one. Accordingly, the display device 10 may receive coordinate data generated without complex calculation and correction by using the data code, thereby performing the corresponding function according to the correct input coordinates, reducing cost and power consumption, and simplifying a driving process. In addition, the display device 10 may include the code pattern CP incorporated in the touch sensing element TSU, and thus might not necessarily be limited in size and may be applied to all electronic devices having a touch function.

The second insulating layer SIL2 may be disposed on the bridge electrode CE, the light blocking pattern BSL, and the first insulating layer SIL1 The second insulating layer SIL2 may have an insulating and optical function.

Figure 9:
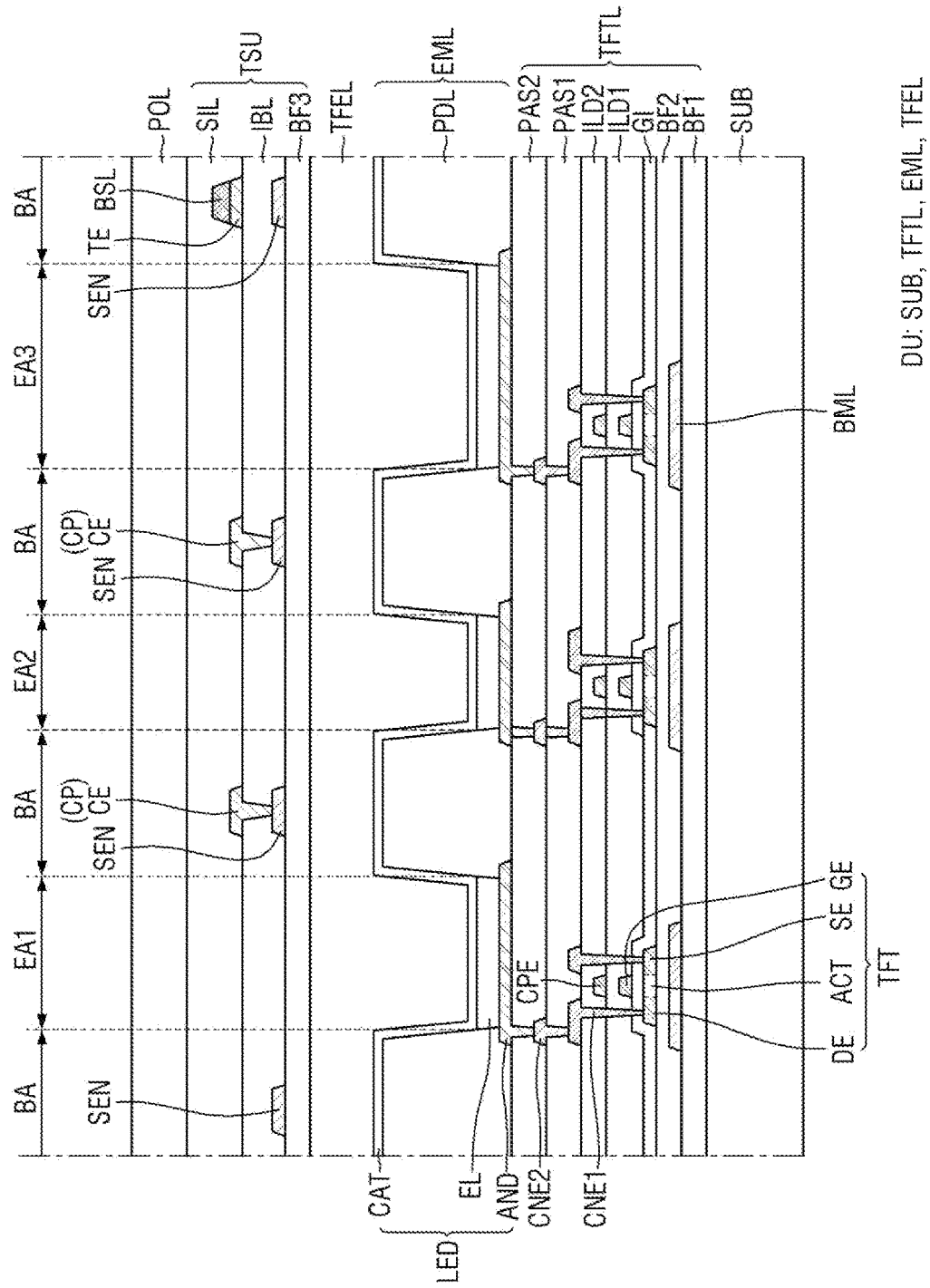
FIG. 9 is a cross-sectional view showing a display device according to an embodiment of the present disclosure.

FIG. 9 is a cross-sectional view showing a display device according to an embodiment. The display device of FIG. 9 is different from the display device of FIG. 8 in the configuration of a wavelength absorption layer IBL and a code pattern CP, and to the extent that a detailed description of an embodiment has been omitted, it may be assumed that the element is at least similar to a corresponding element that has been described in detail elsewhere within the instant disclosure.

Referring to FIG. 9, the touch sensing element TSU may be disposed on the encapsulation layer TFEL. The touch sensing element TSU may include a third buffer layer BF3, a plurality of touch electrodes SEN, a wavelength absorption layer IBL, a bridge electrode CE, a light blocking pattern BSL, and an insulating layer SIL.

The plurality of touch electrodes SEN may be disposed on the third buffer layer BF3. The plurality of touch electrodes SEN might not overlap the first to third emission areas EA1, EA2, and EA3. The touch electrode SEN may be formed of a single layer containing molybdenum (Mo), titanium (Ti), copper (Cu), aluminum (Al), or indium tin oxide (ITO), or may have a stacked structure (Ti/Al/Ti) of aluminum and titanium, a stacked structure (ITO/Al/ITO) of aluminum and ITO, an Ag—Pd—Cu (APC) alloy, or a stacked structure (ITO/APC/ITO) of APC alloy and ITO.

The wavelength absorption layer IBL may be disposed on the plurality of touch electrodes SEN and the third buffer layer BF3. The wavelength absorption layer IBL may transmit visible light and absorb light of a specific wavelength. The wavelength absorption layer IBL may include an infrared absorbing material or an ultraviolet absorbing material. For example, the wavelength absorption layer IBL may be an inorganic layer including an inorganic black pigment. The wavelength absorption layer IBL may be formed on the plurality of touch electrodes SEN through a chemical vapor deposition (CVD) process. In the wavelength absorption layer IBL, the absorbance of a specific wavelength may be adjusted depending on the content of the inorganic black pigment. The inorganic black pigment may be carbon black but is not necessarily limited thereto. The wavelength absorption layer IBL may include silicon nitride (SiNx), silicon oxide (SiOx), or silicon carbide (SiC).

For example, the wavelength absorption layer IBL may be an organic layer including an organic black pigment. The wavelength absorption layer IBL may be formed on the plurality of touch electrodes SEN through a coating process or an inkjet process. In the wavelength absorption layer IBL, the absorbance of a specific wavelength may be adjusted depending on the content of the organic black pigment. The organic black pigment may include lactam black, perylene black, and/or aniline black, but is not necessarily limited thereto.

The bridge electrode CE may be disposed on the wavelength absorption layer IBL. The bridge electrode CE may be disposed on a different layer from the plurality of touch electrodes SEN to connect the driving electrodes TE adjacent in the Y-axis direction to each other. The bridge electrode CE may reflect light of a specific wavelength. The bridge electrode CE may include an infrared reflective material or an ultraviolet reflective material.

The light blocking pattern BSL may be disposed on at least a part of the bridge electrode CE. The light blocking pattern BSL may absorb light of a specific wavelength, and the bridge electrode CE or the touch electrode SEN that does not overlap the light blocking pattern BSL may reflect light of a specific wavelength. The light blocking pattern BSL may include an infrared absorbing material or an ultraviolet absorbing material. For example, the light blocking pattern BSL may include an inorganic black pigment or an organic black pigment. The inorganic black pigment may be carbon black, and the organic black pigment may include lactam black, perylene black, and/or aniline black, but they are not necessarily limited thereto.

Therefore, when the camera captures an image of the touch sensing element TSU using infrared or ultraviolet light, the bridge electrode CE disposed on the wavelength absorption layer IBL may be distinguished from the light blocking pattern BSL and the touch electrode SEN disposed under the wavelength absorption layer IBL. The touch sensing element TSU may further include a code pattern CP determined by the planar shape of the bridge electrode CE that is not covered by the light blocking pattern BSL. Since the code pattern CP is photographed by a camera that uses infrared or ultraviolet light, the image quality of the display device 10 might not be deteriorated.

The insulating layer SIL may be disposed on the bridge electrode CE and the wavelength absorption layer IBL. The insulating layer SIL may have an insulating and optical function. For example, the insulating layer SIL may be an inorganic layer containing a silicon nitride layer, a silicon oxynitride layer, a silicon oxide layer, a titanium oxide layer, and/or an aluminum oxide layer.

The plurality of code patterns CP may be disposed over the entire touch sensor area TSA of the touch sensing element TSU, and each of the plurality of code patterns CP may have position information according to a specific criterion. The code pattern CP may be photographed by a camera approaching the front of the display device 10 and may be identified through the captured video or image. At least one code pattern CP or a combination of the code patterns CP may correspond to a preset data code value. For example, the code pattern CP disposed at a specific position may correspond to a data code designated at the corresponding position.

The display device 10 may include the plurality of code patterns CP determined by the planar shape of the bridge electrode CE not covered by the light blocking pattern BSL, thereby receiving an input from an input device such as an input stylus. At least one code pattern CP or a combination of the code patterns CP may have position information according to a specific criterion and may correspond to a preset data code one-to-one. Accordingly, the display device 10 may receive coordinate data generated without complex calculation and correction by using the data code, thereby performing the corresponding function according to the correct input coordinates, reducing cost and power consumption, and simplifying a driving process. In addition, the display device 10 may include the code pattern CP incorporated in the touch sensing element TSU, and thus might not necessarily be limited in size and may be applied to all electronic devices having a touch function.

Figure 10:
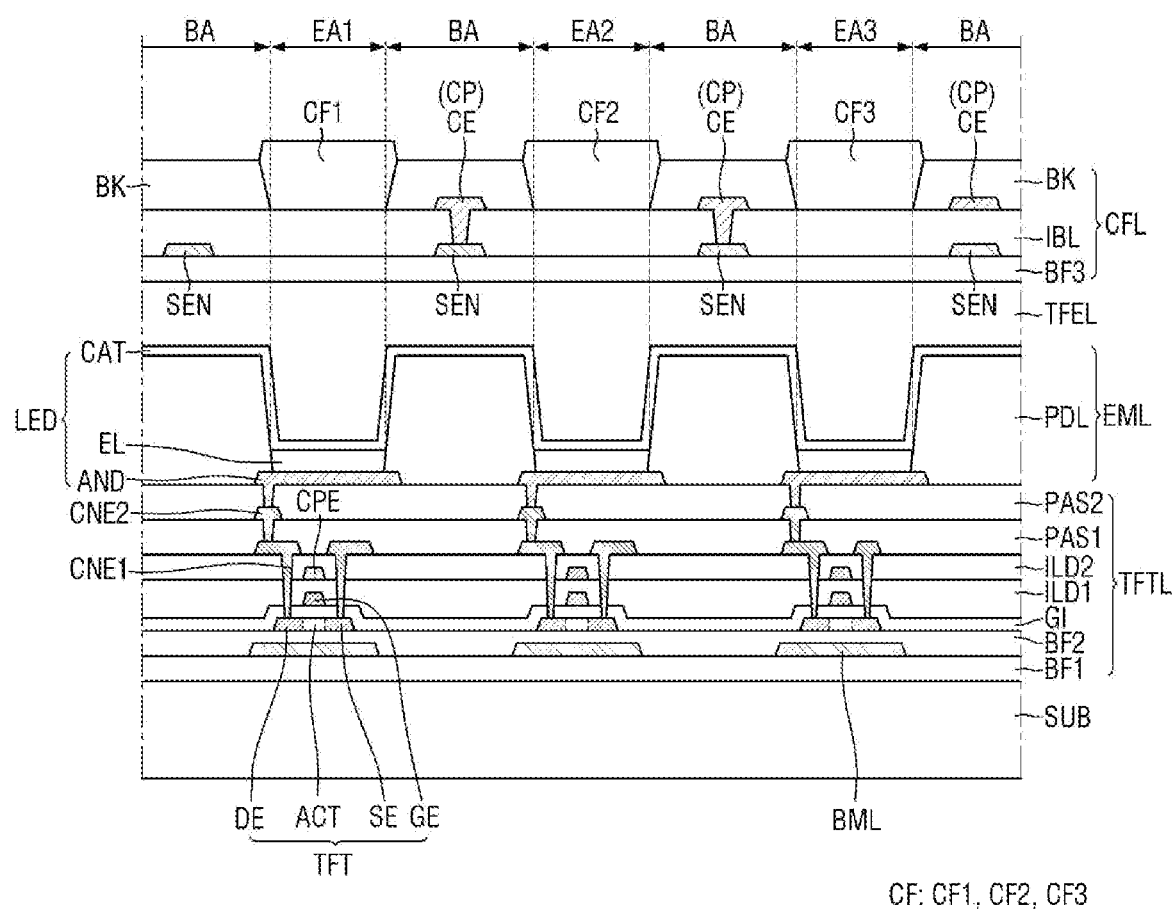
FIG. 10 is a cross-sectional view showing a display device according to an embodiment of the present disclosure.

FIG. 10 is a cross-sectional view showing a display device according to an embodiment. The display device of FIG. 10 is different from the display device of FIG. 7 in a configuration above the encapsulation layer, and to the extent that a detailed description of an embodiment has been omitted, it may be assumed that the element is at least similar to a corresponding element that has been described in detail elsewhere within the instant disclosure.

Referring to FIG. 10, the display panel 100 may include the substrate SUB, the thin film transistor layer TFTL, the light emitting element layer EML, the encapsulation layer TFEL, and a color filter layer CFL.

The substrate SUB may be a base substrate or a base element. For example, the SUB may include a glass material or a metal material. For example, the substrate SUB may include a polymer resin such as polyimide (PI).

The thin film transistor layer TFTL may be disposed on the substrate SUB. The thin film transistor layer TFTL may include a first buffer layer BF1, a light blocking layer BML, a second buffer layer BF2, a thin film transistor TFT, a gate insulating layer GI, a first interlayer insulating layer ILD1, a capacitor electrode CPE, a second interlayer insulating layer ILD2, a first connection electrode CNE1, a first passivation layer PAS1, a second connection electrode CNE2, and a second passivation layer PAS2.

The light emitting element layer EML may be disposed on the thin film transistor layer TFTL. The light emitting element layer EML may include a light emitting element LED and a pixel defining layer PDL. The light emitting element LED may include a pixel electrode AND, a light emitting layer EL, and a common electrode CAT.

The encapsulation layer TFEL may be disposed on the common electrode CAT to cover a plurality of light emitting elements LED.

The color filter layer CFL may be disposed on the encapsulation layer TFEL. The color filter layer CFL may include a third buffer layer BF3, a plurality of touch electrodes SEN, a wavelength absorption layer IBL, a bridge electrode CE, a light blocking part BK, and a plurality of color filters CF.

The plurality of touch electrodes SEN may be disposed on the third buffer layer BF3. The plurality of touch electrodes SEN might not overlap the first to third emission areas EA1, EA2, and EA3. The touch electrode SEN may be formed of a single layer containing molybdenum (Mo), titanium (Ti), copper (Cu), aluminum (Al), or indium tin oxide (ITO), or may have a stacked structure (Ti/Al/Ti) of aluminum and titanium, a stacked structure (ITO/Al/ITO) of aluminum and ITO, an Ag—Pd—Cu (APC) alloy, or a stacked structure (ITO/APC/ITO) of APC alloy and ITO.

The wavelength absorption layer IBL may be disposed on the plurality of touch electrodes SEN and the third buffer layer BF3. The wavelength absorption layer IBL may transmit visible light and absorb light of a specific wavelength. The wavelength absorption layer IBL may include an infrared absorbing material or an ultraviolet absorbing material. For example, the wavelength absorption layer IBL may be an inorganic layer including an inorganic black pigment. The wavelength absorption layer IBL may be formed on the plurality of touch electrodes SEN through a chemical vapor deposition (CVD) process. In the wavelength absorption layer IBL, the absorbance of a specific wavelength may be adjusted depending on the content of the inorganic black pigment. The inorganic black pigment may be carbon black but is not necessarily limited thereto. The wavelength absorption layer IBL may include silicon nitride (SiNx), silicon oxide (SiOx), or silicon carbide (SiC).

For example, the wavelength absorption layer IBL may be an organic layer including an organic black pigment. The wavelength absorption layer IBL may be formed on the plurality of touch electrodes SEN through a coating process or an inkjet process. In the wavelength absorption layer IBL, the absorbance of a specific wavelength may be adjusted depending on the content of the organic black pigment. The organic black pigment may include lactam black, perylene black, and/or aniline black, but is not necessarily limited thereto.

The bridge electrode CE may be disposed on the wavelength absorption layer IBL. The bridge electrode CE may be disposed on a different layer from the plurality of touch electrodes SEN to connect the driving electrodes TE adjacent in the Y-axis direction to each other. The bridge electrode CE may reflect light of a specific wavelength. The bridge electrode CE may include an infrared reflective material or an ultraviolet reflective material.

The light blocking part BK may be disposed in a light blocking area BA on the wavelength absorption layer IBL and may cover the bridge electrode CE. The light blocking part BK may overlap the pixel defining layer PDL in the thickness direction. The light blocking part BK may block visible light and transmit infrared or ultraviolet light. The light blocking part BK may prevent visible light infiltration and color mixture between the first to third emission areas EA1, EA2, and EA3, which leads to the increase of color reproducibility of the display device 10. The light blocking part BK may be arranged in the form of a grid at least partially surrounding the first to third emission areas EA1, EA2, and EA3 in a plan view.

For example, the light blocking part BK may include an organic black pigment. The organic black pigment may include lactam black, perylene black, or aniline black, and may preferably include lactam black.

Accordingly, when the camera captures an image of the color filter layer CFL using infrared or ultraviolet light, the bridge electrode CE disposed on the wavelength absorption layer IBL may be distinguished from the touch electrode SEN disposed under the wavelength absorption layer IBL. The color filter layer CFL may further include a code pattern CP determined by the planar shape of the bridge electrode CE. Since the code pattern CP is photographed by a camera that uses infrared or ultraviolet light, the image quality of the display device 10 might not be deteriorated.

The display device 10 may include the plurality of code patterns CP determined by the planar shape of the bridge electrode CE, thereby receiving an input from an input device such as an input stylus. At least one code pattern CP or a combination of the code patterns CP may have position information according to a specific criterion and may correspond to a preset data code one-to-one. Accordingly, the display device 10 may receive coordinate data generated without complex calculation and correction by using the data code, thereby performing the corresponding function according to the correct input coordinates, reducing cost and power consumption, and simplifying a driving process. In addition, the display device 10 may include a code pattern CP incorporated in the color filter layer CFL, and thus might not necessarily be limited in size and may be applied to all electronic devices having a touch function.

The plurality of color filters CF may include first to third color filters CF1, CF2, and CF3. The first to third color filters CF1, CF2, and CF3 may be disposed above the third buffer layer BF3 to correspond to the first to third emission areas EA1, EA2, and EA3, respectively.

The first color filter CF1 may be disposed in the first emission area EA1 on the wavelength absorption layer IBL. The first color filter CF1 may be at least partially surrounded by the light blocking part BK. The first color filter CF1 may selectively allow the first color light (e.g., red light) to pass therethrough, and block or absorb the second color light (e.g., green light) and the third color light (e.g., blue light). For example, the first color filter CF1 may be a red color filter and may contain a red colorant.

The second color filter CF2 may be disposed in the second emission area EA2 on the wavelength absorption layer IBL. The second color filter CF2 may be at least partially surrounded by the light blocking part BK. The second color filter CF2 may selectively allow the second color light (e.g., green light) to pass therethrough, and block or absorb the first color light (e.g., red light) and the third color light (e.g., blue light). For example, the second color filter CF2 may be a green color filter and may contain a green colorant.

The third color filter CF3 may be disposed in the third emission area EA3 on the wavelength absorption layer IBL. The third color filter CF3 may be at least partially surrounded by the light blocking part BK. The third color filter CF3 may selectively allow the third color light (e.g., blue light) to pass therethrough, and block or absorb the first color light (e.g., red light) and the second color light (e.g., green light). For example, the third color filter CF3 may be a blue color filter and may contain a blue colorant.

The first to third color filters CF1, CF2, and CF3 may absorb a part of the light coming from the outside of the display device 10 to reduce the reflected light of the external light. Thus, the first to third color filters CF1, CF2, and CF3 can prevent color distortion caused by the reflection of the external light.

Since the color filter layer CFL is directly disposed on the encapsulation layer TFEL, the display device 10 might not require a separate substrate for the color filter layer CFL. Therefore, the thickness of the display device 10 may be reduced.

Figure 11:
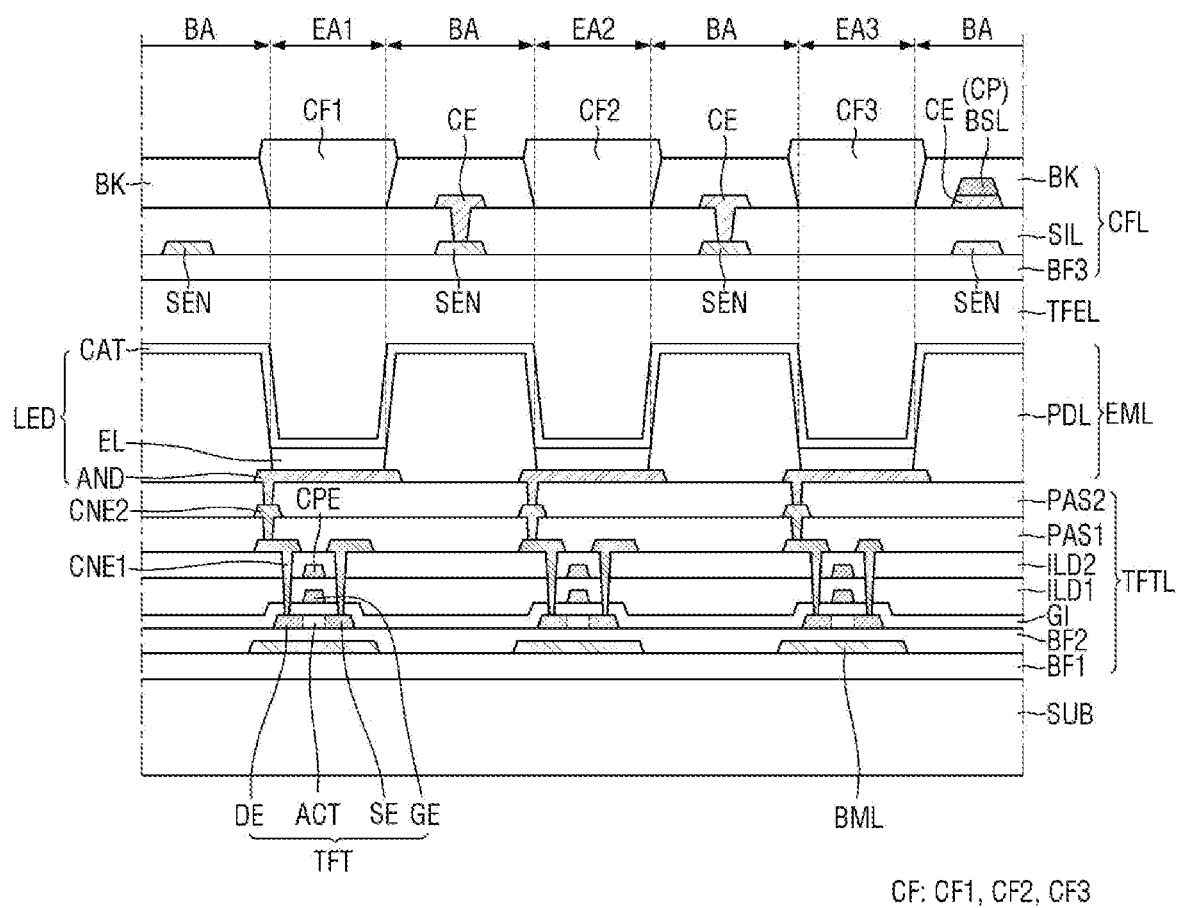
FIG. 11 is a cross-sectional view showing a display device according to an embodiment of the present disclosure.

FIG. 11 is a cross-sectional view showing a display device according to an embodiment. The display device of FIG. 11 further includes a light blocking pattern BSL without including the wavelength absorption layer IBL of the display device of FIG. 10, and to the extent that a detailed description of an embodiment has been omitted, it may be assumed that the element is at least similar to a corresponding element that has been described in detail elsewhere within the instant disclosure.

Referring to FIG. 11, the color filter layer CFL may be disposed on the encapsulation layer TFEL. The color filter layer CFL may include a third buffer layer BF3, a plurality of touch electrodes SEN, an insulating layer SIL, a bridge electrode CE, a light blocking pattern BSL, a light blocking part BK, and a plurality of color filters CF.

The plurality of touch electrodes SEN may be disposed on the third buffer layer BF3. The plurality of touch electrodes SEN might not overlap the first to third emission areas EA1, EA2, and EA3.

The insulating layer SIL may be disposed on the plurality of touch electrodes SEN and the third buffer layer BF3. The insulating layer SIL may have an insulating and optical function. The insulating layer SIL might not absorb light of a specific wavelength or may absorb a relatively small amount of light of a specific wavelength. For example, the insulating layer SIL may transmit infrared or ultraviolet light.

The bridge electrode CE may be disposed on the insulating layer SIL. The bridge electrode CE may be disposed on a different layer from the plurality of touch electrodes SEN to connect the driving electrodes TE adjacent in the Y-axis direction to each other. The bridge electrode CE may reflect light of a specific wavelength. The bridge electrode CE may include an infrared reflective material or an ultraviolet reflective material.

The light blocking pattern BSL may be disposed on at least a part of the bridge electrode CE. The light blocking pattern BSL may absorb light of a specific wavelength, and the bridge electrode CE or the touch electrode SEN that does not overlap the light blocking pattern BSL may reflect light of a specific wavelength. The light blocking pattern BSL may include an infrared absorbing material or an ultraviolet absorbing material. For example, the light blocking pattern BSL may include an inorganic black pigment or an organic black pigment. The inorganic black pigment may be carbon black, and the organic black pigment may include lactam black, perylene black, and/or aniline black, but they are not necessarily limited thereto.

The light blocking part BK may be disposed in the light blocking area BA on the insulating layer SIL and may cover the bridge electrode CE and the light blocking pattern BSL. The light blocking part BK may overlap the pixel defining layer PDL in the thickness direction. The light blocking part BK may block visible light and transmit infrared or ultraviolet light. The light blocking part BK may prevent visible light infiltration and color mixture between the first to third emission areas EA1, EA2, and EA3, which leads to the increase of color reproducibility of the display device 10. The light blocking part BK may be arranged in the form of a grid at least partially surrounding the first to third emission areas EA1, EA2, and EA3 in a plan view.

Accordingly, when the camera captures an image of the color filter layer CFL using infrared or ultraviolet light, the light blocking pattern BSL may be distinguished from the bridge electrode CE or the touch electrode SEN. The color filter layer CFL may further include a code pattern CP determined by the planar shape of the light blocking pattern BSL. Since the code pattern CP is photographed by a camera that uses infrared or ultraviolet light, the image quality of the display device 10 might not be deteriorated.

The display device 10 may include the plurality of code patterns CP determined by the planar shape of the light blocking pattern BSL, thereby receiving an input from an input device such as an input stylus. At least one code pattern CP or a combination of the code patterns CP may have position information according to a specific criterion and may correspond to a preset data code one-to-one. Accordingly, the display device 10 may receive coordinate data generated without complex calculation and correction by using the data code, thereby performing the corresponding function according to the correct input coordinates, reducing cost and power consumption, and simplifying a driving process. In addition, the display device 10 may include a code pattern CP incorporated in the color filter layer CFL, and thus might not necessarily be limited in size and may be applied to all electronic devices having a touch function.

The plurality of color filters CF may include first to third color filters CF1, CF2, and CF3. The first to third color filters CF1, CF2, and CF3 may be disposed above the third buffer layer BF3 to correspond to the first to third emission areas EA1, EA2, and EA3, respectively.

Figure 12:
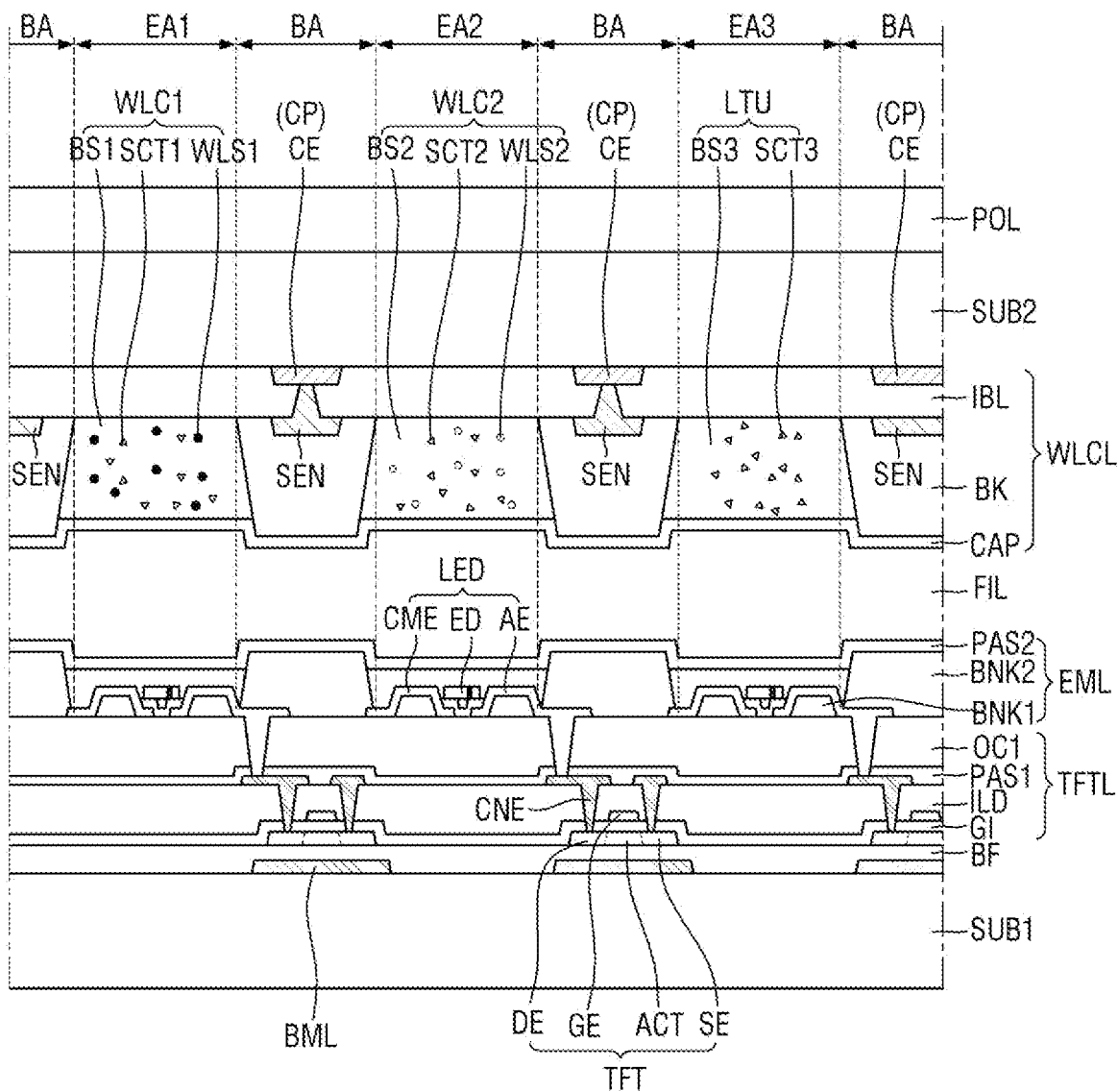
FIG. 12 is a cross-sectional view showing a display device according to an embodiment of the present disclosure.

FIG. 12 is a cross-sectional view showing a display device according to an embodiment. The display device of FIG. 12 is different from the display device of FIG. 7 in that it has a different configuration of a light emitting element layer EML and further includes a wavelength conversion layer WLCL. To the extent that a detailed description of an embodiment has been omitted, it may be assumed that the element is at least similar to a corresponding element that has been described in detail elsewhere within the instant disclosure.

Referring to FIG. 12, the display panel 100 may include a first substrate SUB1, the thin film transistor layer TFTL, the light emitting element layer EML, a filling layer FIL, a wavelength conversion layer WLCL, a second substrate SUB2, and the polarizing film POL.

The first substrate SUB1 may be a base substrate or a base element. For example, the first substrate SUB1 may include a glass material or a metal material. For example, the first substrate SUB1 may include a polymer resin such as polyimide (PI).

The thin film transistor layer TFTL may be disposed on the first substrate SUB1. The thin film transistor layer TFTL may include a buffer layer BF, a light blocking layer BML, a thin film transistor TFT, a gate insulating layer GI, an interlayer insulating layer ILD, a connection electrode CNE, a first passivation layer PAS1, and a first planarization layer OC1.

The light emitting element layer EML may be disposed on the thin film transistor layer TFTL. The light emitting element layer EML may include a light emitting element LED, a first bank BNK1, a second bank BNK2, and a second passivation layer PAS2.

The light emitting element LED may be disposed on the thin film transistor layer TFTL. The light emitting element LED may include a first electrode AE, a second electrode CME, and a light emitting diode ED.

The first electrode AE may be disposed on the first planarization layer OC1. For example, the first electrode AE may cover the first bank BNK1 provided on the first planarization layer OC1. The first electrode AE may overlap one of the first to third emission areas EA1, EA2, and EA3 defined by the second bank BNK2. The first electrode AE may be connected to the drain electrode DE of the thin film transistor TFT through the connection electrode CNE. The first electrode AE may be an anode electrode of the light emitting element LED but is not necessarily limited thereto.

The second electrode CME may be disposed on the first planarization layer OC1 to be spaced apart from the first electrode AE. For example, the second electrode CME may cover the first bank BNK1 disposed on the first planarization layer OC1. The second electrode CME may overlap one of the first to third emission areas EA1, EA2, and EA3 defined by the second bank BNK2. For example, the second electrode CME may receive a low potential voltage supplied from a low potential line to all the pixels. The second electrode CME may be a cathode electrode of the light emitting element LED but is not necessarily limited thereto.

The light emitting diode ED may be disposed between the first electrode AE and the second electrode CME on the first planarization layer OC1. One end of the light emitting diode ED may be connected to the first electrode AE, and the other end of the light emitting diode ED may be connected to the second electrode CME. The light emitting diode ED may have a micro-meter or nano-meter size, and may be an inorganic light emitting diode including an inorganic material. The inorganic light emitting diode may be aligned between two electrodes facing each other by an electric field formed in a specific direction between the two electrodes.

The plurality of light emitting diodes ED may include active layers containing the same material to emit light in the same wavelength band or light of the same color. Light emitted from each of the first to third emission areas EA1, EA2, and EA3 may have the same color. For example, the light emitting diodes ED may emit the third color light or blue light having a peak wavelength in the range of 440 nm to 480 nm. Therefore, the light emitting element layer EML may emit the third color light or blue light.

The second bank BNK2 may be disposed in the light blocking area BA on the first planarization layer OC1. The second bank BNK2 may define the first to third emission areas EA1, EA2 and EA3. For example, the second bank BNK2 may at least partially surround each of the first to third emission areas EA1, EA2 and EA3, but is not necessarily limited thereto. The second bank BNK2 may separate and insulate the first electrode AE or the second electrode CME of each of the plurality of light emitting elements LED.

The second passivation layer PAS2 may be disposed on the plurality of light emitting elements LED and the second bank BNK2. The second passivation layer PAS2 may cover the plurality of light emitting elements LED and may protect the plurality of light emitting elements LED. The second passivation layer PAS2 may prevent infiltration of impurities such as moisture or air from the outside to prevent damage to the plurality of light emitting elements LED.

The filling layer FIL may fill the space between the light emitting element layer EML and the wavelength conversion layer WLCL and be at least partially surrounded by a sealing element (e.g., a sealant). For example, the filling layer FIL may be made of an organic material allowing light to pass therethrough. The filling layer FIL may be made of a silicon-based organic material, an epoxy-based organic material, or the like, but is not necessarily limited thereto. In an example, the filling layer FIL may be omitted.

The wavelength conversion layer WLCL may include a capping layer CAP, a light blocking part BK, a plurality of touch electrodes SEN, a first wavelength conversion part WLC1, a second wavelength conversion part WLC2, a light transmission element LTU, a wavelength absorption layer IBL, and a bridge electrode CE.

The capping layer CAP may be disposed on the filling layer FIL. The capping layer CAP may cover the bottom surfaces of the first and second wavelength conversion parts WLC1 and WLC2, the light transmission element LTU, and the light blocking part BK. For example, the capping layer CAP may seal the first and second wavelength conversion parts WLC1 and WLC2 and the light transmission element LTU to prevent the first and second wavelength conversion parts WLC1 and WLC2 and the light transmission element LTU from damage or contamination. For example, the capping layer CAP may include an inorganic material.

The first wavelength conversion part WLC1 may be disposed in the first emission area EA1 on the capping layer CAP. The first wavelength conversion part WLC1 may be at least partially surrounded by the light blocking part BK. The first wavelength conversion part WLC1 may include a first based resin BS1, a first scatterer SCT1, and a first wavelength shifter WLS1.

The first base resin BS1 may contain a material having a relatively high light transmittance. The first base resin BS1 may be formed of a transparent organic material.

The first scatterer SCT1 may have a refractive index different from that of the first base resin BS1 and form an optical interface with the first base resin BS1. For example, the first scatterer SCT1 may contain a light scattering material or light scattering particles that scatter at least a part of the transmitted light. The first scatterer SCT1 may scatter light in random directions regardless of the incidence direction of the incident light without any substantial change of the peak wavelength of the incident light.

The first wavelength shifter WLS1 may change or shift the peak wavelength of the incident light to a first peak wavelength. For example, the first wavelength shifter WLS1 may convert blue light provided from the display device 10 into red light having a single peak wavelength in the range of 610 nm to 650 nm and emit the red light.

The second wavelength conversion part WLC2 may be disposed in the second emission area EA2 on the capping layer CAP. The second wavelength conversion part WLC2 may be at least partially surrounded by the light blocking part BK. The second wavelength conversion part WLC2 may include a second base resin BS2, a second scatterer SCT2, and a second wavelength shifter WLS2.

The second base resin BS2 may contain a material having a relatively high light transmittance. The second base resin BS2 may be formed of a transparent organic material.

The second scatterer SCT2 may have a refractive index different from that of the second base resin BS2 and form an optical interface with the second base resin BS2. For example, the second scatterer SCT2 may contain a light scattering material or light scattering particles scattering at least a part of the transmitted light. The second scatterer SCT2 may scatter the light in random directions regardless of the incidence direction of the incident light without any substantial change of the peak wavelength of the incident light.

The second wavelength shifter WLS2 may change or shift the peak wavelength of the incident light to a second peak wavelength different from the first peak wavelength of the first wavelength shifter WLS1. For example, the second wavelength shifter WLS2 may convert blue light provided from the display device 10 into green light having a single peak wavelength in the range of 510 nm to 550 nm and emit the green light.

The light transmission element LTU may be disposed in the third emission area EA3 on the capping layer CAP. The light transmission element LTU may be at least partially surrounded by the light blocking part BK. The light transmission element LTU may allow the incident light to pass therethrough while maintaining the peak wavelength of the light. The light transmission element LTU may include a third base resin BS3 and a third scatterer SCT3.

The third base resin BS3 may contain a material having a relatively high light transmittance. The third base resin BS3 may be formed of a transparent organic material.

The third scatterer SCT3 may have a refractive index different from that of the third base resin BS3 and form an optical interface with the third base resin BS3. For example, the third scatterer SCT3 may contain a light scattering material or light scattering particles scattering at least a part of the transmitted light. The third scatterer SCT3 may scatter the light in random directions regardless of the incidence direction of the incident light without any substantial change of the peak wavelength of the incident light.

The light blocking part BK may be disposed in the light blocking area BA on the capping layer CAP. The light blocking part BK may cover the bottom surfaces of the plurality of touch electrodes SEN. The light blocking part BK may overlap the second bank BNK2 in the thickness direction. The light blocking part BK may at least partially surround the first and second wavelength conversion parts WLC1 and WLC2 and the light transmission element LTU in a plan view. The light blocking part BK may block transmission of light. The light blocking part BK may prevent light infiltration and color mixture between the first to third emission areas EA1, EA2, and EA3, which leads to the increase of color reproducibility of the display device 10. The light blocking part BK may be arranged in the form of a grid at least partially surrounding the first to third emission areas EA1, EA2, and EA3 in a plan view.

The plurality of touch electrodes SEN may be disposed on one surface of the wavelength absorption layer IBL facing the first substrate SUB1. The top surfaces of the touch electrodes SEN may be covered by the wavelength absorption layer IBL, and the bottom surfaces of the touch electrodes SEN may be covered by the light blocking part BK. Accordingly, the plurality of touch electrodes SEN may be disposed in the wavelength conversion layer WLCL without requiring a separate touch sensor layer. The touch electrode SEN may be formed of a single layer containing molybdenum (Mo), titanium (Ti), copper (Cu), aluminum (Al), or indium tin oxide (ITO), or may have a stacked structure (Ti/Al/Ti) of aluminum and titanium, a stacked structure (ITO/Al/ITO) of aluminum and ITO, an Ag—Pd—Cu (APC) alloy, or a stacked structure (ITO/APC/ITO) of APC alloy and ITO.

The wavelength absorption layer IBL may be disposed on the plurality of touch electrodes SEN, the first wavelength conversion part WLC1, the second wavelength conversion part WLC2, the light transmission element LTU, and the light blocking part BK. The wavelength absorption layer IBL may transmit visible light and absorb light of a specific wavelength. The wavelength absorption layer IBL may include an infrared absorbing material or an ultraviolet absorbing material. For example, the wavelength absorption layer IBL may be an inorganic layer including an inorganic black pigment. The wavelength absorption layer IBL may be formed on the plurality of touch electrodes SEN through a chemical vapor deposition (CVD) process. In the wavelength absorption layer IBL, the absorbance of a specific wavelength may be adjusted depending on the content of the inorganic black pigment. The inorganic black pigment may be carbon black but is not necessarily limited thereto. The wavelength absorption layer IBL may include silicon nitride (SiNx), silicon oxide (SiOx), or silicon carbide (SiC).

For example, the wavelength absorption layer IBL may be an organic layer including an organic black pigment. The wavelength absorption layer IBL may be formed on the plurality of touch electrodes SEN through a coating process or an inkjet process. In the wavelength absorption layer IBL, the absorbance of a specific wavelength may be adjusted depending on the content of the organic black pigment. The organic black pigment may include lactam black, perylene black, and/or aniline black, but is not necessarily limited thereto.

The bridge electrode CE may be disposed on the wavelength absorption layer IBL. The bridge electrode CE may be disposed on a different layer from the plurality of touch electrodes SEN to connect the driving electrodes TE adjacent in the Y-axis direction to each other. The bridge electrode CE may reflect light of a specific wavelength. The bridge electrode CE may include an infrared reflective material or an ultraviolet reflective material.

Accordingly, when the camera captures an image of the wavelength conversion layer WLCL using infrared or ultraviolet light, the bridge electrode CE disposed on the wavelength absorption layer IBL may be distinguished from the touch electrode SEN disposed under the wavelength absorption layer IBL. The wavelength conversion layer WLCL may further include a code pattern CP determined by the planar shape of the bridge electrode CE. Since the code pattern CP is photographed by a camera that uses infrared or ultraviolet light, the image quality of the display device 10 might not be deteriorated.

The display device 10 may include the plurality of code patterns CP determined by the planar shape of the bridge electrode CE, thereby receiving an input from an input device such as an input stylus. At least one code pattern CP or a combination of the code patterns CP may have position information according to a specific criterion and may correspond to a preset data code one-to-one. Accordingly, the display device 10 may receive coordinate data generated without complex calculation and correction by using the data code, thereby performing the corresponding function according to the correct input coordinates, reducing cost and power consumption, and simplifying a driving process. In addition, the display device 10 may include a code pattern CP incorporated in the color filter layer CFL, and thus might not necessarily be limited in size and may be applied to all electronic devices having a touch function.

The second substrate SUB2 may be disposed on the wavelength conversion layer WLCL. The second substrate SUB2 may support and protect the display device 10. The second substrate SUB2 may be a base substrate or a base element. For example, the second substrate SUB2 may include a glass material or a metal material. For example, the second substrate SUB2 may include a polymer resin such as polyimide (PI).

The polarizing film POL may be disposed on the second substrate SUB2. For example, the polarizing film POL may include a phase retardation film such as a linear polarizer plate and a quarter-wave ($\lambda$/4) plate. The phase retardation film and the linear polarizer plate may be sequentially stacked on the second substrate SUB2.

Figure 13:
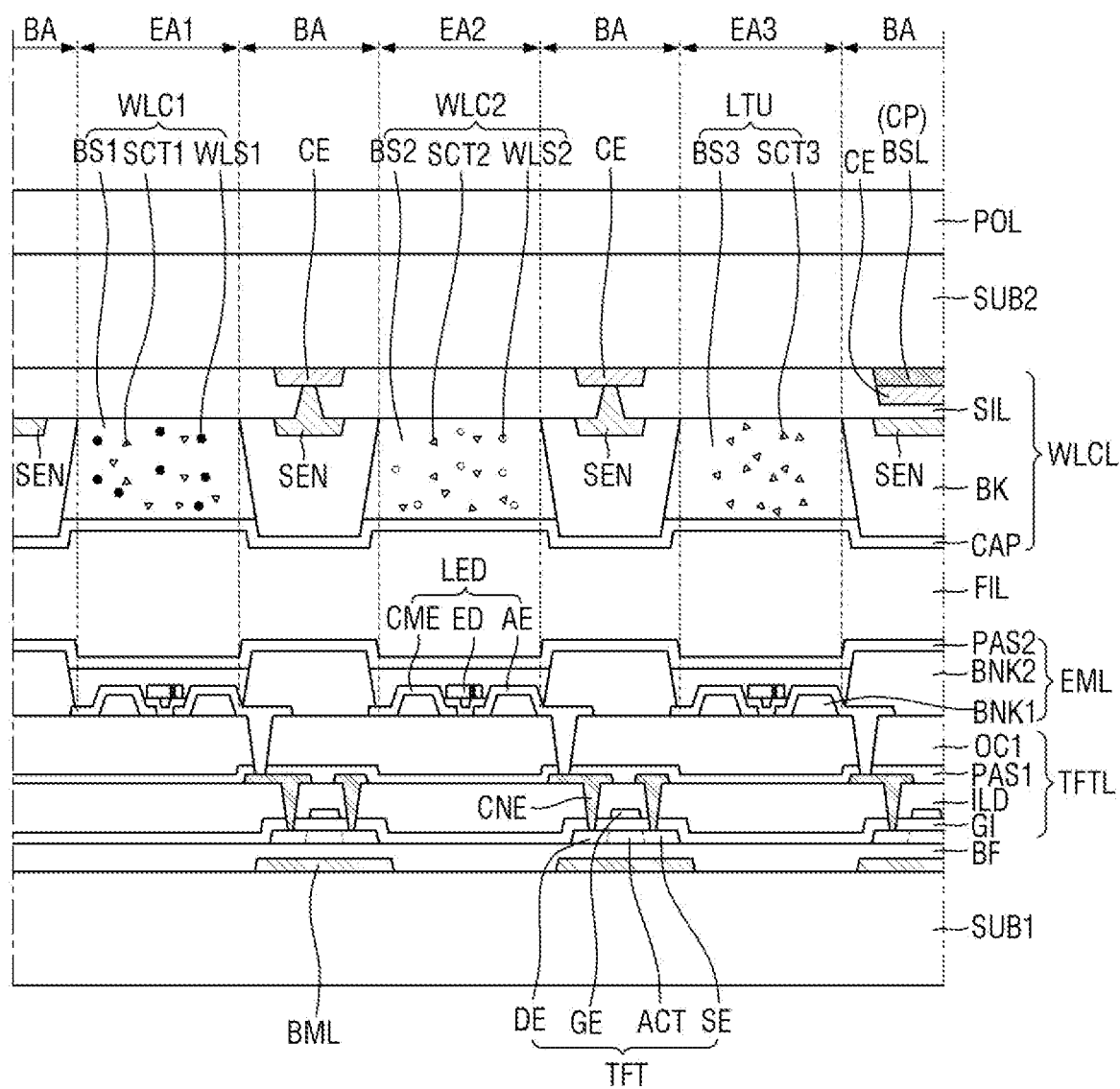
FIG. 13 is a cross-sectional view showing a display device according to an embodiment of the present disclosure.

FIG. 13 is a cross-sectional view showing a display device according to an embodiment. The display device of FIG. 13 further includes a light blocking pattern BSL without including the wavelength absorption layer IBL of the display device of FIG. 12, and the same configuration as the above-described configuration will be briefly described or omitted.

Referring to FIG. 13, the wavelength conversion layer WLCL may include a capping layer CAP, a light blocking part BK, a plurality of touch electrodes SEN, a first wavelength conversion part WLC1, a second wavelength conversion part WLC2, a light transmission element LTU, an insulating layer SIL, a bridge electrode CE, and a light blocking pattern BSL.

The light blocking part BK may be disposed in the light blocking area BA on the capping layer CAP. The light blocking part BK may cover the bottom surfaces of the plurality of touch electrodes SEN. The light blocking part BK may overlap the second bank BNK2 in the thickness direction. The light blocking part BK may at least partially surround the first and second wavelength conversion parts WLC1 and WLC2 and the light transmission element LTU in a plan view. The light blocking part BK may block transmission of light. The light blocking part BK may prevent light infiltration and color mixture between the first to third emission areas EA1, EA2, and EA3, which leads to the increase of color reproducibility of the display device 10. The light blocking part BK may be arranged in the form of a grid at least partially surrounding the first to third emission areas EA1, EA2, and EA3 in a plan view.

The plurality of touch electrodes SEN may be disposed on one surface of the wavelength absorption layer IBL facing the first substrate SUB1. Thus, the top surfaces of the touch electrodes SEN may be covered by the wavelength absorption layer IBL, and the bottom surfaces of the touch electrodes SEN may be covered by the light blocking part BK. Accordingly, the plurality of touch electrodes SEN may be disposed in the wavelength conversion layer WLCL without requiring a separate touch sensor layer. The touch electrode SEN may be formed of a single layer containing molybdenum (Mo), titanium (Ti), copper (Cu), aluminum (Al), or indium tin oxide (ITO), or may have a stacked structure (Ti/Al/Ti) of aluminum and titanium, a stacked structure (ITO/Al/ITO) of aluminum and ITO, an Ag—Pd—Cu (APC) alloy, or a stacked structure (ITO/APC/ITO) of APC alloy and ITO.

The insulating layer SIL may be disposed on the plurality of touch electrodes SEN, the first wavelength conversion part WLC1, the second wavelength conversion part WLC2, the light transmission element LTU, and the light blocking part BK. The insulating layer SIL may have an insulating and optical function. The insulating layer SIL might not absorb light of a specific wavelength or may absorb a relatively small amount of light of a specific wavelength. For example, the insulating layer SIL may transmit infrared or ultraviolet light.

The bridge electrode CE may be disposed on the insulating layer SIL. The bridge electrode CE may be disposed on a different layer from the plurality of touch electrodes SEN to connect the driving electrodes TE adjacent in the Y-axis direction to each other. The bridge electrode CE may reflect light of a specific wavelength. The bridge electrode CE may include an infrared reflective material or an ultraviolet reflective material.

The light blocking pattern BSL may be disposed on at least a part of the bridge electrode CE. The light blocking pattern BSL may absorb light of a specific wavelength, and the bridge electrode CE or the touch electrode SEN that does not overlap the light blocking pattern BSL may reflect light of a specific wavelength. The light blocking pattern BSL may include an infrared absorbing material or an ultraviolet absorbing material. For example, the light blocking pattern BSL may include an inorganic black pigment or an organic black pigment. The inorganic black pigment may be carbon black, and the organic black pigment may include lactam black, perylene black, and/or aniline black, but they are not necessarily limited thereto.

Accordingly, when the camera captures an image of the wavelength conversion layer WLCL using infrared or ultraviolet light, the light blocking pattern BSL may be distinguished from the bridge electrode CE or the touch electrode SEN. The wavelength conversion layer WLCL may further include a code pattern CP determined by the planar shape of the light blocking pattern BSL. Since the code pattern CP is photographed by a camera that uses infrared or ultraviolet light, the image quality of the display device 10 might not be deteriorated.

The display device 10 may include the plurality of code patterns CP determined by the planar shape of the light blocking pattern BSL, thereby receiving an input from an input device such as an input stylus. At least one code pattern CP or a combination of the code patterns CP may have position information according to a specific criterion and may correspond to a preset data code one-to-one. Accordingly, the display device 10 may receive coordinate data generated without complex calculation and correction by using the data code, thereby performing the corresponding function according to the correct input coordinates, reducing cost and power consumption, and simplifying a driving process. In addition, the display device 10 may include a code pattern CP incorporated in the wavelength conversion layer WLCL, and thus might not necessarily be limited in size and may be applied to all electronic devices having a touch function.

Figure 14:
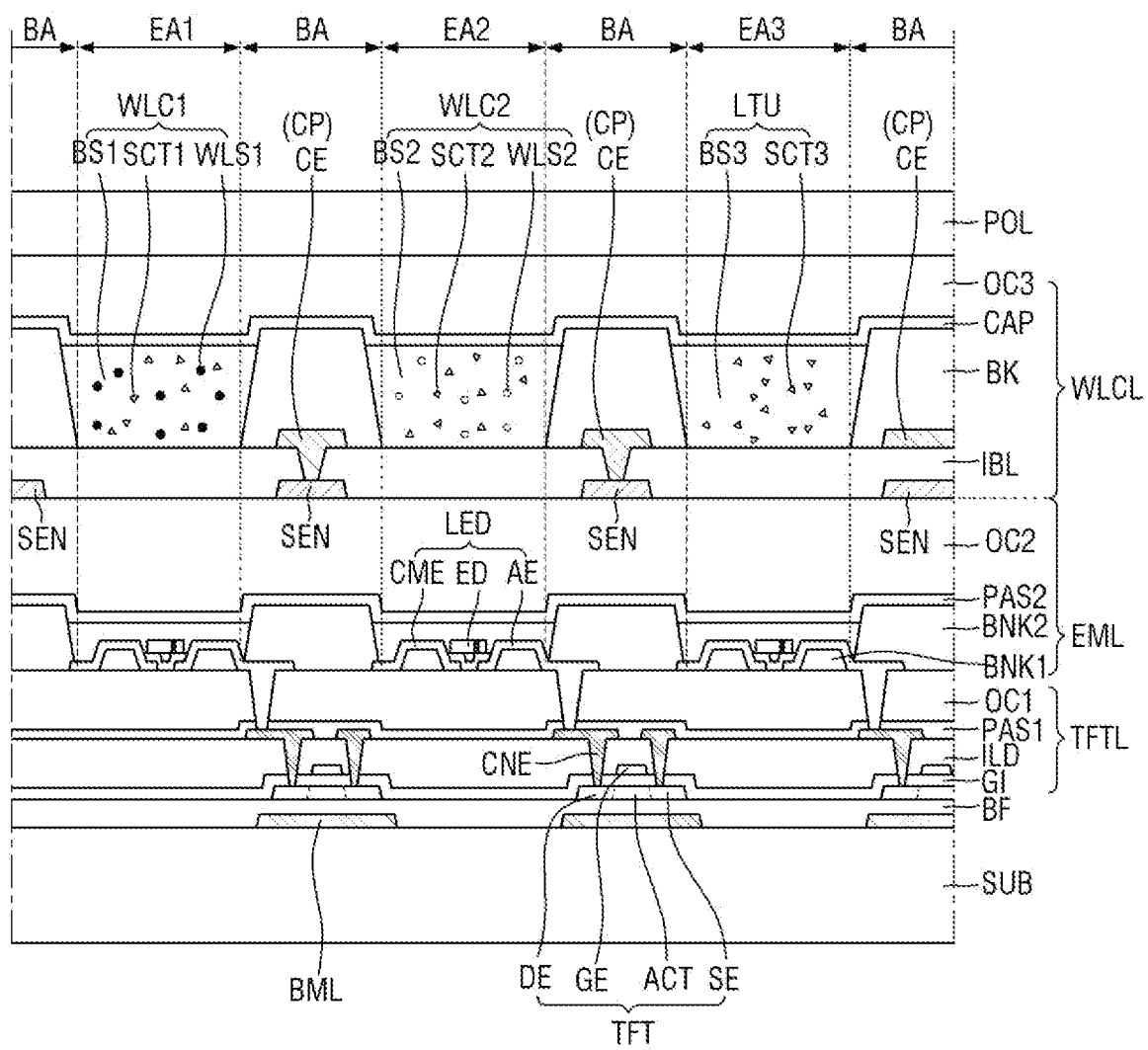
FIG. 14 is a cross-sectional view showing a display device according to an embodiment of the present disclosure.

FIG. 14 is a cross-sectional view showing a display device according to an embodiment. The display device of FIG. 14 is different from the display device of FIG. 12 in that it does not include a second substrate SUB2 and has a different configuration of a wavelength conversion layer WLCL. To the extent that a detailed description of an embodiment has been omitted, it may be assumed that the element is at least similar to a corresponding element that has been described in detail elsewhere within the instant disclosure.

Referring to FIG. 14, the display panel 100 may include the substrate SUB, the thin film transistor layer TFTL, the light emitting element layer EML, the wavelength conversion layer WLCL, and the polarizing film POL.

The substrate SUB may be a base substrate or a base element. For example, the SUB may include a glass material or a metal material. For example, the substrate SUB may include a polymer resin such as polyimide (PI).

The thin film transistor layer TFTL may be disposed on the substrate SUB. The thin film transistor layer TFTL may include a buffer layer BF, a light blocking layer BML, a thin film transistor TFT, a gate insulating layer GI, an interlayer insulating layer ILD, a connection electrode CNE, a first passivation layer PAS1, and a first planarization layer OC1.

The light emitting element layer EML may be disposed on the thin film transistor layer TFTL. The light emitting element layer EML may include a light emitting element LED, a first bank BNK1, a second bank BNK2, a second passivation layer PAS2, and a second planarization layer OC2. The second planarization layer OC2 may be provided on the second passivation layer PAS2 to planarize a top portion of the light emitting element layer EML. For example, the second planarization layer OC2 may include an organic material.

The wavelength conversion layer WLCL may include a plurality of touch electrodes SEN, a wavelength absorption layer IBL, a bridge electrode CE, a light blocking part BK, a first wavelength conversion part WLC1, a second wavelength conversion part WLC2, a light transmission element LTU, a capping layer CAP, and a third planarization layer OC3.

The plurality of touch electrodes SEN may be disposed in the light blocking area BA on the second planarization layer OC2. Accordingly, the plurality of touch electrodes SEN may be disposed in the wavelength conversion layer WLCL without requiring a separate touch sensor layer. The touch electrode SEN may be formed of a single layer containing molybdenum (Mo), titanium (Ti), copper (Cu), aluminum (Al), or indium tin oxide (ITO), or may have a stacked structure (Ti/Al/Ti) of aluminum and titanium, a stacked structure (ITO/Al/ITO) of aluminum and ITO, an Ag—Pd—Cu (APC) alloy, or a stacked structure (ITO/APC/ITO) of APC alloy and ITO.

The wavelength absorption layer IBL may be disposed on the plurality of touch electrodes SEN and the second planarization layer OC2. The wavelength absorption layer IBL may transmit visible light and absorb light of a specific wavelength. The wavelength absorption layer IBL may include an infrared absorbing material or an ultraviolet absorbing material. For example, the wavelength absorption layer IBL may be an inorganic layer including an inorganic black pigment. The wavelength absorption layer IBL may be formed on the plurality of touch electrodes SEN through a chemical vapor deposition (CVD) process. In the wavelength absorption layer IBL, the absorbance of a specific wavelength may be adjusted depending on the content of the inorganic black pigment. The inorganic black pigment may be carbon black, but is not necessarily limited thereto. The wavelength absorption layer IBL may include silicon nitride (SiNx), silicon oxide (SiOx), or silicon carbide (SiC).

For example, the wavelength absorption layer IBL may be an organic layer including an organic black pigment. The wavelength absorption layer IBL may be formed on the plurality of touch electrodes SEN through a coating process or an inkjet process. In the wavelength absorption layer IBL, the absorbance of a specific wavelength may be adjusted depending on the content of the organic black pigment. The organic black pigment may include lactam black, perylene black, and/or aniline black, but is not necessarily limited thereto.

The bridge electrode CE may be disposed in the light blocking area BA on the wavelength absorption layer IBL. The bridge electrode CE may be disposed on a different layer from the plurality of touch electrodes SEN to connect the driving electrodes TE adjacent in the Y-axis direction to each other. The bridge electrode CE may reflect light of a specific wavelength. The bridge electrode CE may include an infrared reflective material or an ultraviolet reflective material.

The light blocking part BK may be disposed in the light blocking area BA on the capping layer CAP. The light blocking part BK may cover the bridge electrode CE. The light blocking part BK may overlap the second bank BNK2 in the thickness direction. The light blocking part BK may at least partially surround the first and second wavelength conversion parts WLC1 and WLC2 and the light transmission element LTU in a plan view. The light blocking part BK may block visible light and transmit infrared or ultraviolet light. The light blocking part BK may prevent visible light infiltration and color mixture between the first to third emission areas EA1, EA2, and EA3, which leads to the increase of color reproducibility of the display device 10. The light blocking part BK may be arranged in the form of a grid at least partially surrounding the first to third emission areas EA1, EA2, and EA3 in a plan view.

Accordingly, when the camera captures an image of the wavelength conversion layer WLCL using infrared or ultraviolet light, the bridge electrode CE disposed on the wavelength absorption layer IBL may be distinguished from the touch electrode SEN disposed under the wavelength absorption layer IBL. The wavelength conversion layer WLCL may further include a code pattern CP determined by the planar shape of the bridge electrode CE. Since the code pattern CP is photographed by a camera that uses infrared or ultraviolet light, the image quality of the display device 10 might not be deteriorated.

The display device 10 may include the plurality of code patterns CP determined by the planar shape of the bridge electrode CE, thereby receiving an input from an input device such as an input stylus. At least one code pattern CP or a combination of the code patterns CP may have position information according to a specific criterion and may correspond to a preset data code one-to-one. Accordingly, the display device 10 may receive coordinate data generated without complex calculation and correction by using the data code, thereby performing the corresponding function according to the correct input coordinates, reducing cost and power consumption, and simplifying a driving process. In addition, the display device 10 may include a code pattern CP incorporated in the color filter layer CFL, and thus might not necessarily be limited in size and may be applied to all electronic devices having a touch function.

The first wavelength conversion part WLC1 may be disposed in the first emission area EA1 on the wavelength absorption layer IBL. The first wavelength conversion part WLC1 may be at least partially surrounded by the light blocking part BK. The first wavelength conversion part WLC1 may include a first based resin BS1, a first scatterer SCT1, and a first wavelength shifter WLS1.

The second wavelength conversion part WLC2 may be disposed in the second emission area EA2 on the wavelength absorption layer IBL. The second wavelength conversion part WLC2 may be at least partially surrounded by the light blocking part BK. The second wavelength conversion part WLC2 may include a second base resin BS2, a second scatterer SCT2, and a second wavelength shifter WLS2.

The light transmission element LTU may be disposed in the third emission area EA3 on the wavelength absorption layer IBL. The light transmission element LTU may be at least partially surrounded by the light blocking part BK. The light transmission element LTU may allow the incident light to pass therethrough while maintaining the peak wavelength of the light. The light transmission element LTU may include a third base resin BS3 and a third scatterer SCT3.

The capping layer CAP may cover the first and second wavelength conversion parts WLC1 and WLC2, the light transmission element LTU, and the light blocking part BK. For example, the capping layer CAP may seal the first and second wavelength conversion parts WLC1 and WLC2 and the light transmission element LTU to prevent the first and second wavelength conversion parts WLC1 and WLC2 and the light transmission element LTU from damage or contamination. For example, the capping layer CAP may include an inorganic material.

The third planarization layer OC3 may be disposed on the capping layer CAP to planarize top portions of the first and second wavelength conversion parts WLC1 and WLC2 and the light transmission element LTU. For example, the third planarization layer OC3 may include an organic material.

The polarizing film POL may be disposed on the third planarization layer OC3. For example, the polarizing film POL may include a phase retardation film such as a linear polarizer plate and a quarter-wave (λ/4) plate. The phase retardation film and the linear polarizer plate may be sequentially stacked on the third planarization layer OC3.

Figure 15:
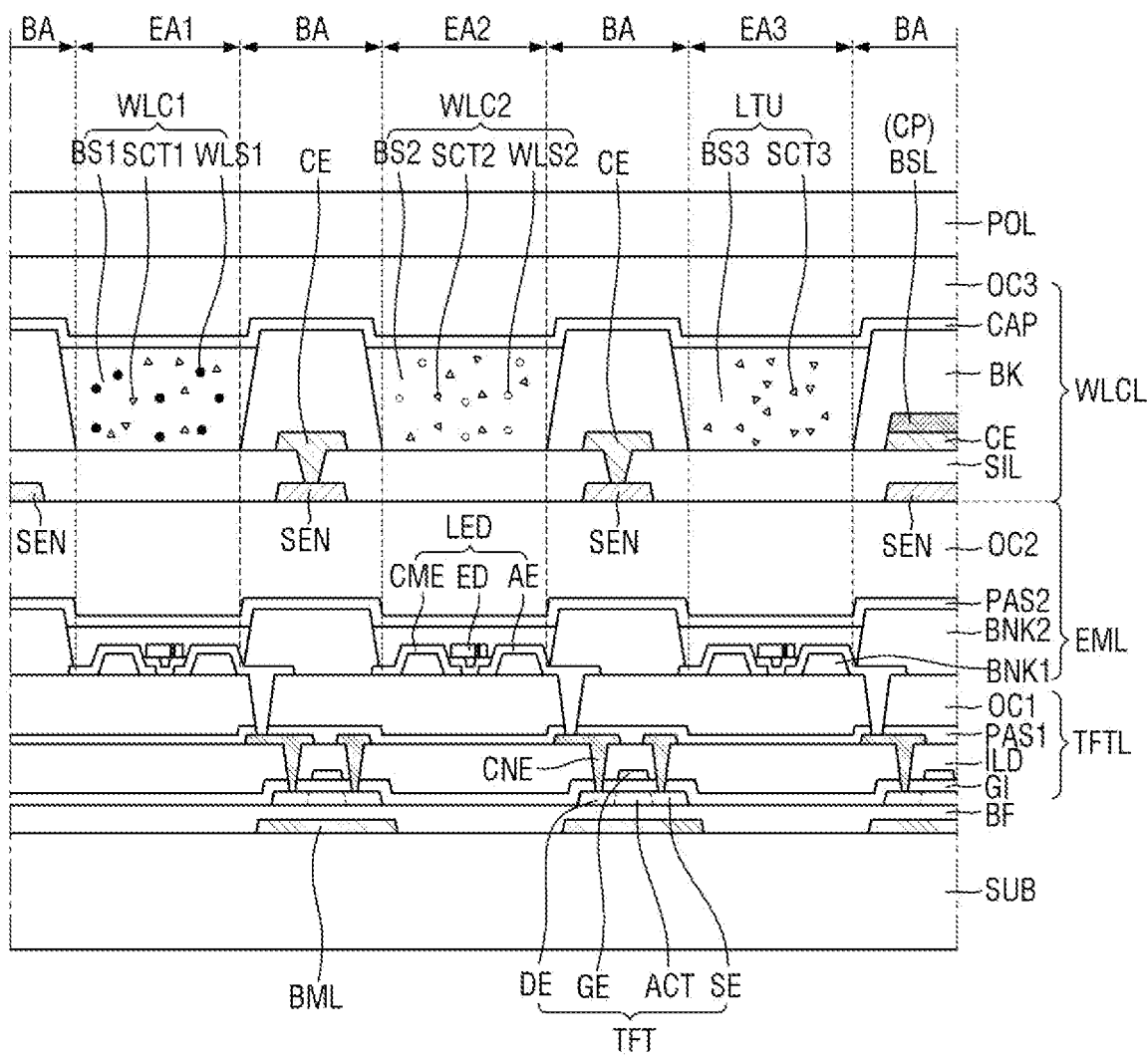
FIG. 15 is a cross-sectional view showing a display device according to an embodiment of the present disclosure.

FIG. 15 is a cross-sectional view showing a display device according to an embodiment. The display device of FIG. 15 further includes a light blocking pattern BSL without including the wavelength absorption layer IBL of the display device of FIG. 14, and to the extent that a detailed description of an embodiment has been omitted, it may be assumed that the element is at least similar to a corresponding element that has been described in detail elsewhere within the instant disclosure.

Referring to FIG. 15, the wavelength conversion layer WLCL may include a plurality of touch electrodes SEN, an insulating layer SIL, a bridge electrode CE, a light blocking pattern BSL, a light blocking part BK, a first wavelength conversion part WLC1, a second wavelength conversion part WLC2, a light transmission element LTU, a capping layer CAP, and a third planarization layer OC3.

The plurality of touch electrodes SEN may be disposed in the light blocking area BA on the second planarization layer OC2. Accordingly, the plurality of touch electrodes SEN may be disposed in the wavelength conversion layer WLCL without requiring a separate touch sensor layer.

The insulating layer SIL may be disposed on the plurality of touch electrodes SEN and the second planarization layer OC2. The insulating layer SIL may have an insulating and optical function. The insulating layer SIL might not absorb light of a specific wavelength or may absorb a relatively small amount of light of a specific wavelength. For example, the insulating layer SIL may transmit infrared or ultraviolet light.

The bridge electrode CE may be disposed on the insulating layer SIL. The bridge electrode CE may be disposed on a different layer from the plurality of touch electrodes SEN to connect the driving electrodes TE adjacent in the Y-axis direction to each other. The bridge electrode CE may reflect light of a specific wavelength. The bridge electrode CE may include an infrared reflective material or an ultraviolet reflective material.

The light blocking pattern BSL may be disposed on at least a part of the bridge electrode CE. The light blocking pattern BSL may absorb light of a specific wavelength, and the bridge electrode CE or the touch electrode SEN that does not overlap the light blocking pattern BSL may reflect light of a specific wavelength. The light blocking pattern BSL may include an infrared absorbing material or an ultraviolet absorbing material. For example, the light blocking pattern BSL may include an inorganic black pigment or an organic black pigment. The inorganic black pigment may be carbon black, and the organic black pigment may include lactam black, perylene black, and/or aniline black, but they are not necessarily limited thereto.

Accordingly, when the camera captures an image of the wavelength conversion layer WLCL using infrared or ultraviolet light, the light blocking pattern BSL may be distinguished from the bridge electrode CE or the touch electrode SEN. The wavelength conversion layer WLCL may further include a code pattern CP determined by the planar shape of the light blocking pattern BSL. Since the code pattern CP is photographed by a camera that uses infrared or ultraviolet light, the image quality of the display device 10 might not be deteriorated.

The display device 10 may include the plurality of code patterns CP determined by the planar shape of the light blocking pattern BSL, thereby receiving an input from an input device such as an input stylus. At least one code pattern CP or a combination of the code patterns CP may have position information according to a specific criterion and may correspond to a preset data code one-to-one. Accordingly, the display device 10 may receive coordinate data generated without complex calculation and correction by using the data code, thereby performing the corresponding function according to the correct input coordinates, reducing cost and power consumption, and simplifying a driving process. In addition, the display device 10 may include a code pattern CP incorporated in the wavelength conversion layer WLCL, and thus might not necessarily be limited in size and may be applied to all electronic devices having a touch function.

Figure 16:
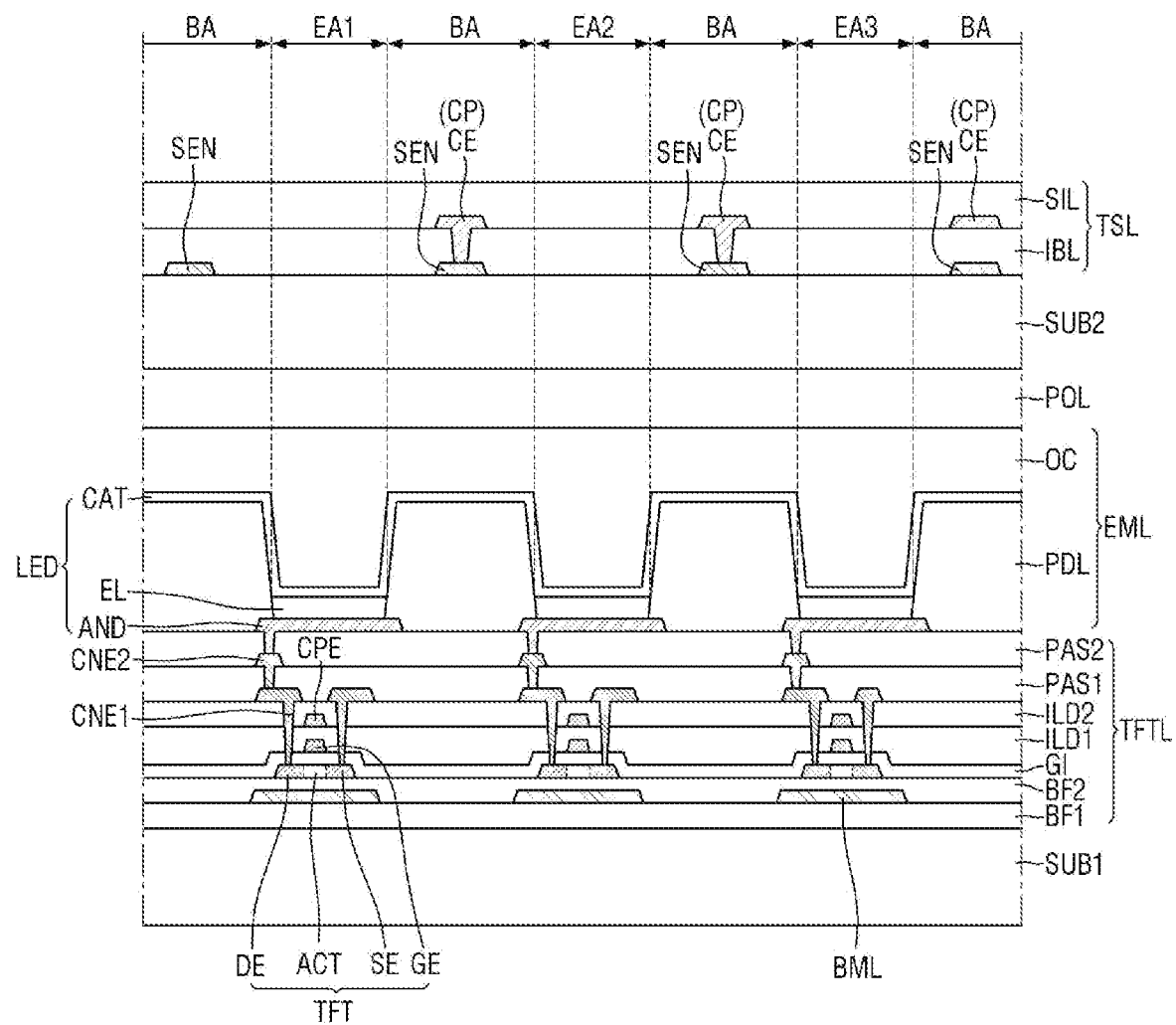
FIG. 16 is a cross-sectional view showing a display device according to an embodiment of the present disclosure.

FIG. 16 is a cross-sectional view showing a display device according to an embodiment. The display device of FIG. 16 is different from the display device of FIG. 7 in a configuration above the light emitting element layer EML. To the extent that a detailed description of an embodiment has been omitted, it may be assumed that the element is at least similar to a corresponding element that has been described in detail elsewhere within the instant disclosure.

Referring to FIG. 16, the display panel 100 may include a first substrate SUB1, the thin film transistor layer TFTL, the light emitting element layer EML, the polarizing film POL, a second substrate SUB2, and a touch sensor layer TSL.

The first substrate SUB1 may be a base substrate or a base element. For example, the first substrate SUB1 may include a glass material or a metal material. For example, the first substrate SUB1 may include a polymer resin such as polyimide (PI).

The thin film transistor layer TFTL may be disposed on the first substrate SUB1. The thin film transistor layer TFTL may include a first buffer layer BF1, a light blocking layer BML, a second buffer layer BF2, a thin film transistor TFT, a gate insulating layer GI, a first interlayer insulating layer ILD1, a capacitor electrode CPE, a second interlayer insulating layer ILD2, a first connection electrode CNE1, a first passivation layer PAS1, a second connection electrode CNE2, and a second passivation layer PAS2.

The light emitting element layer EML may be disposed on the thin film transistor layer TFTL. The light emitting element layer EML may include a light emitting element LED, a pixel defining layer PDL, and a planarization layer OC. The light emitting element LED may include a pixel electrode AND, a light emitting layer EL, and a common electrode CAT. The pixel defining layer PDL may define first to third emission areas EA1, EA2, and EA3. The planarization layer OC may be disposed on the common electrode CAT to planarize the top of the light emitting element layer EML.

The polarizing film POL may be disposed on the light emitting element layer EML. For example, the polarizing film POL may include a phase retardation film such as a linear polarizer plate and a quarter-wave (λ/4) plate. In an example, the polarizing film POL may be disposed on the touch sensor layer TSL.

The second substrate SUB2 may be disposed on the polarizing film POL. The second substrate SUB2 may be a base substrate or a base element. For example, the second substrate SUB2 may include a glass material or a metal material. For example, the second substrate SUB2 may include a polymer resin such as polyimide (PI).

The touch sensor layer TSL may be disposed on the second substrate SUB2. The touch sensor layer TSL may include a plurality of touch electrodes SEN, a wavelength absorption layer IBL, a bridge electrode CE, and an insulating layer SIL.

The plurality of touch electrodes SEN may be disposed on the second substrate SUB2. The plurality of touch electrodes SEN might not overlap the first to third emission areas EA1, EA2, and EA3. The plurality of touch electrodes SEN may be formed in a mesh structure or a net structure in a plan view.

The wavelength absorption layer IBL may be disposed on the plurality of touch electrodes SEN and the second substrate SUB2. The wavelength absorption layer IBL may transmit visible light and absorb light of a specific wavelength. The wavelength absorption layer IBL may include an infrared absorbing material or an ultraviolet absorbing material. For example, the wavelength absorption layer IBL may be an inorganic layer including an inorganic black pigment. The wavelength absorption layer IBL may be formed on the plurality of touch electrodes SEN through a chemical vapor deposition (CVD) process. In the wavelength absorption layer IBL, the absorbance of a specific wavelength may be adjusted depending on the content of the inorganic black pigment. The inorganic black pigment may be carbon black but is not necessarily limited thereto. The wavelength absorption layer IBL may include silicon nitride (SiNx), silicon oxide (SiOx), or silicon carbide (SiC).

For example, the wavelength absorption layer IBL may be an organic layer including an organic black pigment. The wavelength absorption layer IBL may be formed on the plurality of touch electrodes SEN through a coating process or an inkjet process. In the wavelength absorption layer IBL, the absorbance of a specific wavelength may be adjusted depending on the content of the organic black pigment. The organic black pigment may include lactam black, perylene black, and/or aniline black, but is not necessarily limited thereto.

The bridge electrode CE may be disposed in the light blocking area BA on the wavelength absorption layer IBL. The bridge electrode CE may be disposed on a different layer from the plurality of touch electrodes SEN to connect the driving electrodes TE adjacent in the Y-axis direction to each other. The bridge electrode CE may reflect light of a specific wavelength. The bridge electrode CE may include an infrared reflective material or an ultraviolet reflective material.

Accordingly, when the camera captures an image of the touch sensor layer TSL using infrared or ultraviolet light, the bridge electrode CE disposed on the wavelength absorption layer IBL may be distinguished from the touch electrode SEN disposed under the wavelength absorption layer IBL. The touch sensor layer TSL may further include a code pattern CP determined by the planar shape of the bridge electrode CE. Since the code pattern CP is photographed by a camera that uses infrared or ultraviolet light, the image quality of the display device 10 might not be deteriorated.

The display device 10 may include the plurality of code patterns CP determined by the planar shape of the bridge electrode CE, thereby receiving an input from an input device such as an input stylus. At least one code pattern CP or a combination of the code patterns CP may have position information according to a specific criterion and may correspond to a preset data code one-to-one. Accordingly, the display device 10 may receive coordinate data generated without complex calculation and correction by using the data code, thereby performing the corresponding function according to the correct input coordinates, reducing cost and power consumption, and simplifying a driving process. In addition, the display device 10 may include the code pattern CP incorporated in the touch sensor layer TSL, and thus might not necessarily be limited in size and may be applied to all electronic devices having a touch function.

Figure 17:
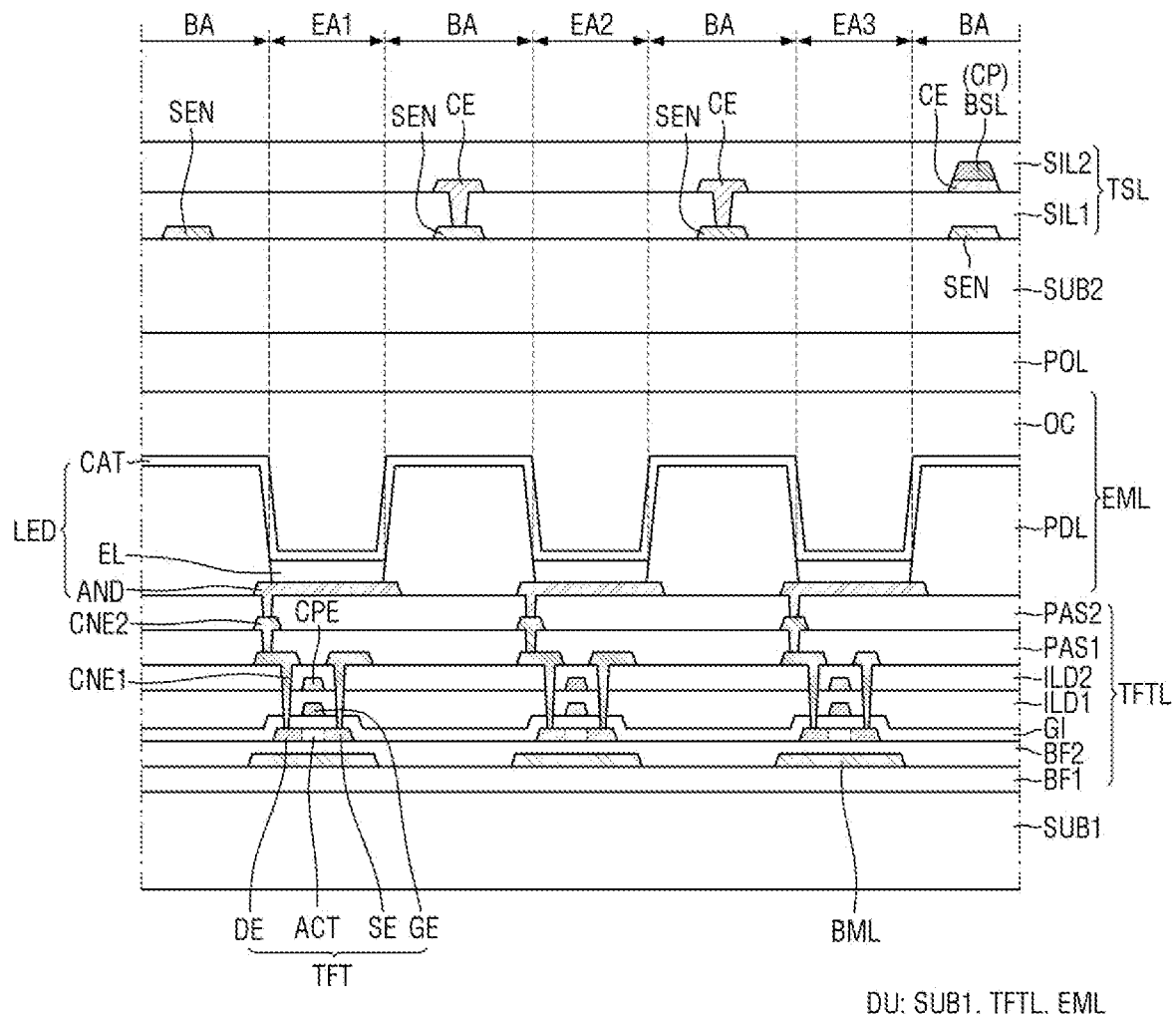
FIG. 17 is a cross-sectional view showing a display device according to an embodiment of the present disclosure.

FIG. 17 is a cross-sectional view showing a display device according to an embodiment. The display device of FIG. 17 further includes a light blocking pattern BSL without including the wavelength absorption layer IBL of the display device of FIG. 16, to the extent that a detailed description of an embodiment has been omitted, it may be assumed that the element is at least similar to a corresponding element that has been described in detail elsewhere within the instant disclosure.

Referring to FIG. 17, the touch sensor layer TSL may be disposed on the second substrate SUB2. The touch sensor layer TSL may include a plurality of touch electrodes SEN, a first insulating layer SIL1, a bridge electrode CE, a light blocking pattern BSL, and a second insulating layer SIL2.

The plurality of touch electrodes SEN may be disposed on the second substrate SUB2. The plurality of touch electrodes SEN might not overlap the first to third emission areas EA1, EA2, and EA3. The plurality of touch electrodes SEN may be formed in a mesh structure or a net structure in a plan view.

The first insulating layer SIL1 may be disposed on the plurality of touch electrodes SEN and the second substrate SUB2. The first insulating layer SIL1 may have an insulating and optical function. The first insulating layer SIL1 might not absorb light of a specific wavelength or may absorb a relatively small amount of light of a specific wavelength. For example, the first insulating layer SIL1 may transmit infrared or ultraviolet light.

The bridge electrode CE may be disposed on the first insulating layer SIL1. The bridge electrode CE may be disposed on a different layer from the plurality of touch electrodes SEN to connect the driving electrodes TE adjacent in the Y-axis direction to each other. The bridge electrode CE may reflect light of a specific wavelength. The bridge electrode CE may include an infrared reflective material or an ultraviolet reflective material.

The light blocking pattern BSL may be disposed on at least a part of the bridge electrode CE. The light blocking pattern BSL may absorb light of a specific wavelength, and the bridge electrode CE or the touch electrode SEN that does not overlap the light blocking pattern BSL may reflect light of a specific wavelength. The light blocking pattern BSL may include an infrared absorbing material or an ultraviolet absorbing material. For example, the light blocking pattern BSL may include an inorganic black pigment or an organic black pigment. The inorganic black pigment may be carbon black, and the organic black pigment may include lactam black, perylene black, and/or aniline black, but they are not necessarily limited thereto.

Accordingly, when the camera captures an image of the touch sensor layer TSL using infrared or ultraviolet light, the light blocking pattern BSL may be distinguished from the bridge electrode CE or the touch electrode SEN. The touch sensor layer TSL may further include the code pattern CP determined by the planar shape of the light blocking pattern BSL. Since the code pattern CP is photographed by a camera that uses infrared or ultraviolet light, the image quality of the display device 10 might not be deteriorated.

The display device 10 may include the plurality of code patterns CP determined by the planar shape of the light blocking pattern BSL, thereby receiving an input from an input device such as an input stylus. At least one code pattern CP or a combination of the code patterns CP may have position information according to a specific criterion and may correspond to a preset data code one-to-one. Accordingly, the display device 10 may receive coordinate data generated without complex calculation and correction by using the data code, thereby performing the corresponding function according to the correct input coordinates, reducing cost and power consumption, and simplifying a driving process. In addition, the display device 10 may include the code pattern CP incorporated in the touch sensor layer TSL, and thus might not necessarily be limited in size and may be applied to all electronic devices having a touch function.

Figure 18:
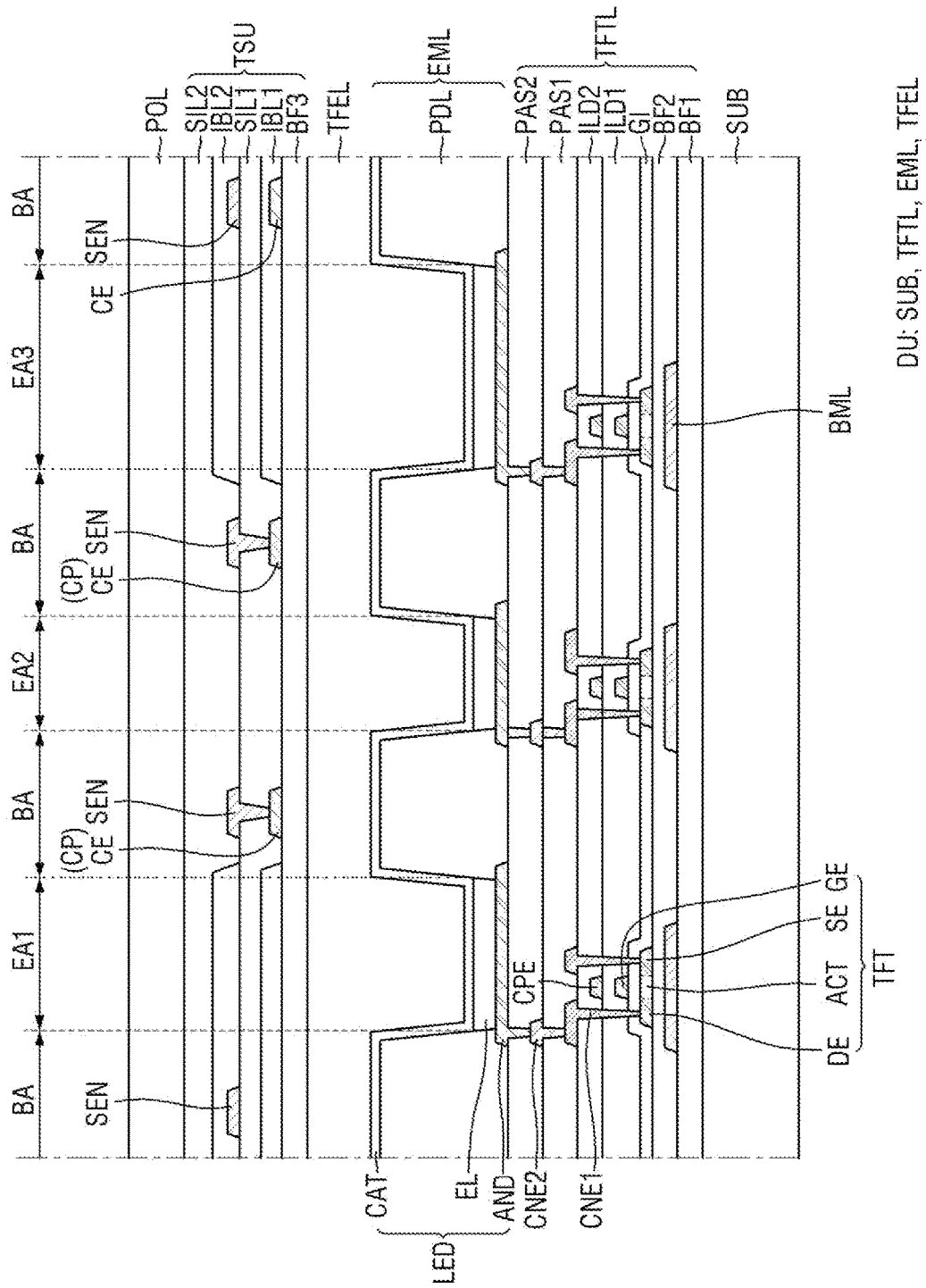
FIG. 18 is a cross-sectional view showing a display device according to an embodiment of the present disclosure.

FIG. 18 is a cross-sectional view showing a display device according to an embodiment.

Referring to FIG. 18, the touch sensing element TSU may be disposed on the encapsulation layer TFEL. The touch sensing element TSU may include a third buffer layer BF3, a bridge electrode CE, a first wavelength absorption layer IBL1, a first insulating layer SILL a plurality of touch electrodes SEN, a second wavelength absorption layer IBL2, and a second insulating layer SIL2.

The bridge electrode CE may be disposed on the third buffer layer BF3. The bridge electrode CE may be disposed on a different layer from the plurality of touch electrodes SEN to connect the driving electrodes TE adjacent in the Y-axis direction to each other. The bridge electrode CE may reflect light of a specific wavelength. The bridge electrode CE may include an infrared reflective material or an ultraviolet reflective material.

The first wavelength absorption layer IBL1 may be disposed on some of a plurality of bridge electrodes CE. The first wavelength absorption layer IBL1 may be disposed on the bridge electrode CE that does not form a code pattern CP. The first wavelength absorption layer IBL1 may transmit visible light and absorb light of a specific wavelength. The first wavelength absorption layer IBL1 may include an infrared absorbing material or an ultraviolet absorbing material. For example, the first wavelength absorption layer IBL1 may be an inorganic layer including an inorganic black pigment. The first wavelength absorption layer IBL1 may be formed on some bridge electrodes CE through a chemical vapor deposition (CVD) process. In the first wavelength absorption layer IBL1, the absorbance of a specific wavelength may be adjusted depending on the content of the inorganic black pigment. The inorganic black pigment may be carbon black but is not necessarily limited thereto. The first wavelength absorption layer IBL1 may include silicon nitride (SiNx), silicon oxide (SiOx), or silicon carbide (SiC).

For example, the first wavelength absorption layer IBL1 may be an organic layer including an organic black pigment. The first wavelength absorption layer IBL1 may be formed on some bridge electrodes CE through a coating process or an inkjet process. In the first wavelength absorption layer IBL1, the absorbance of a specific wavelength may be adjusted depending on the content of the organic black pigment. The organic black pigment may include lactam black, perylene black, and/or aniline black, but is not necessarily limited thereto.

The first insulating layer SIL1 may be disposed on others of the plurality of bridge electrodes CE and the first wavelength absorption layer IBL1. The first insulating layer SIL1 may have an insulating and optical function. The first insulating layer SIL1 might not absorb light of a specific wavelength or may absorb a relatively small amount of light of a specific wavelength. For example, the first insulating layer SIL1 may transmit infrared or ultraviolet light. Optionally, a vertical relationship between the first insulating layer SIL1 and the first wavelength absorption layer IBL1 may be changed.

The plurality of touch electrodes SEN may be disposed on the first insulating layer SIL1. The plurality of touch electrodes SEN might not overlap the first to third emission areas EA1, EA2, and EA3. The touch electrode SEN may be formed of a single layer containing molybdenum (Mo), titanium (Ti), copper (Cu), aluminum (Al), or indium tin oxide (ITO), or may have a stacked structure (Ti/Al/Ti) of aluminum and titanium, a stacked structure (ITO/Al/ITO) of aluminum and ITO, an Ag—Pd—Cu (APC) alloy, or a stacked structure (ITO/APC/ITO) of APC alloy and ITO.

The second wavelength absorption layer IBL2 may be disposed on some of the plurality of touch electrodes SEN. The second wavelength absorption layer IBL2 may be disposed on the touch electrodes SEN that do not overlap the code pattern CP. The second wavelength absorption layer IBL2 may transmit visible light and absorb light of a specific wavelength. The second wavelength absorption layer IBL2 may include an infrared absorbing material or an ultraviolet absorbing material. For example, the second wavelength absorption layer IBL2 may be an inorganic layer including an inorganic black pigment. The second wavelength absorption layer IBL2 may be formed on some touch electrodes SEN through a chemical vapor deposition (CVD) process. In the second wavelength absorption layer IBL2, the absorbance of a specific wavelength may be adjusted depending on the content of the inorganic black pigment. The inorganic black pigment may be carbon black but is not necessarily limited thereto. The second wavelength absorption layer IBL2 may include silicon nitride (SiNx), silicon oxide (SiOx), or silicon carbide (SiC).

For example, the second wavelength absorption layer IBL2 may be an organic layer including an organic black pigment. The second wavelength absorption layer IBL2 may be formed on some bridge electrodes CE through a coating process or an inkjet process. In the second wavelength absorption layer IBL2, the absorbance of a specific wavelength may be adjusted depending on the content of the organic black pigment. The organic black pigment may include lactam black, perylene black, and/or aniline black, but is not necessarily limited thereto.

The second insulating layer SIL2 may be disposed on others of the plurality of touch electrodes SEN and the second wavelength absorption layer IBL2. The second insulating layer SIL2 may have an insulating and optical function. The second insulating layer SIL2 might not absorb light of a specific wavelength or may absorb a relatively small amount of light of a specific wavelength. For example, the second insulating layer SIL2 may transmit infrared or ultraviolet light. Optionally, the vertical relationship between the second insulating layer SIL2 and the second wavelength absorption layer IBL2 may be changed.

When a camera captures an image of the touch sensing element TSU using infrared or ultraviolet light, the bridge electrode CE may be distinguished from the plurality of touch electrodes SEN. Accordingly, since the code pattern CP is photographed by a camera that uses infrared or ultraviolet light, the image quality of the display device 10 might not be deteriorated. The plurality of code patterns CP may be disposed over the entire touch sensor area TSA of the touch sensing element TSU, and each of the plurality of code patterns CP may have position information according to a specific criterion. The code pattern CP may be photographed by a camera approaching the front of the display device 10 and may be identified through the captured video or image. At least one code pattern CP or a combination of the code patterns CP may correspond to a preset data code value. For example, the code pattern CP disposed at a specific position may correspond to a data code designated at the corresponding position.

The display device 10 may include the plurality of code patterns CP determined by the planar shape of the bridge electrode CE, thereby receiving an input from an input device such as an input stylus. At least one code pattern CP or a combination of the code patterns CP may have position information according to a specific criterion and may correspond to a preset data code one-to-one. Accordingly, the display device 10 may receive coordinate data generated without complex calculation and correction by using the data code, thereby performing the corresponding function according to the correct input coordinates, reducing cost and power consumption, and simplifying a driving process. In addition, the display device 10 may include the code pattern CP incorporated in the touch sensing element TSU, and thus might not necessarily be limited in size and may be applied to all electronic devices having a touch function.

Figure 19:
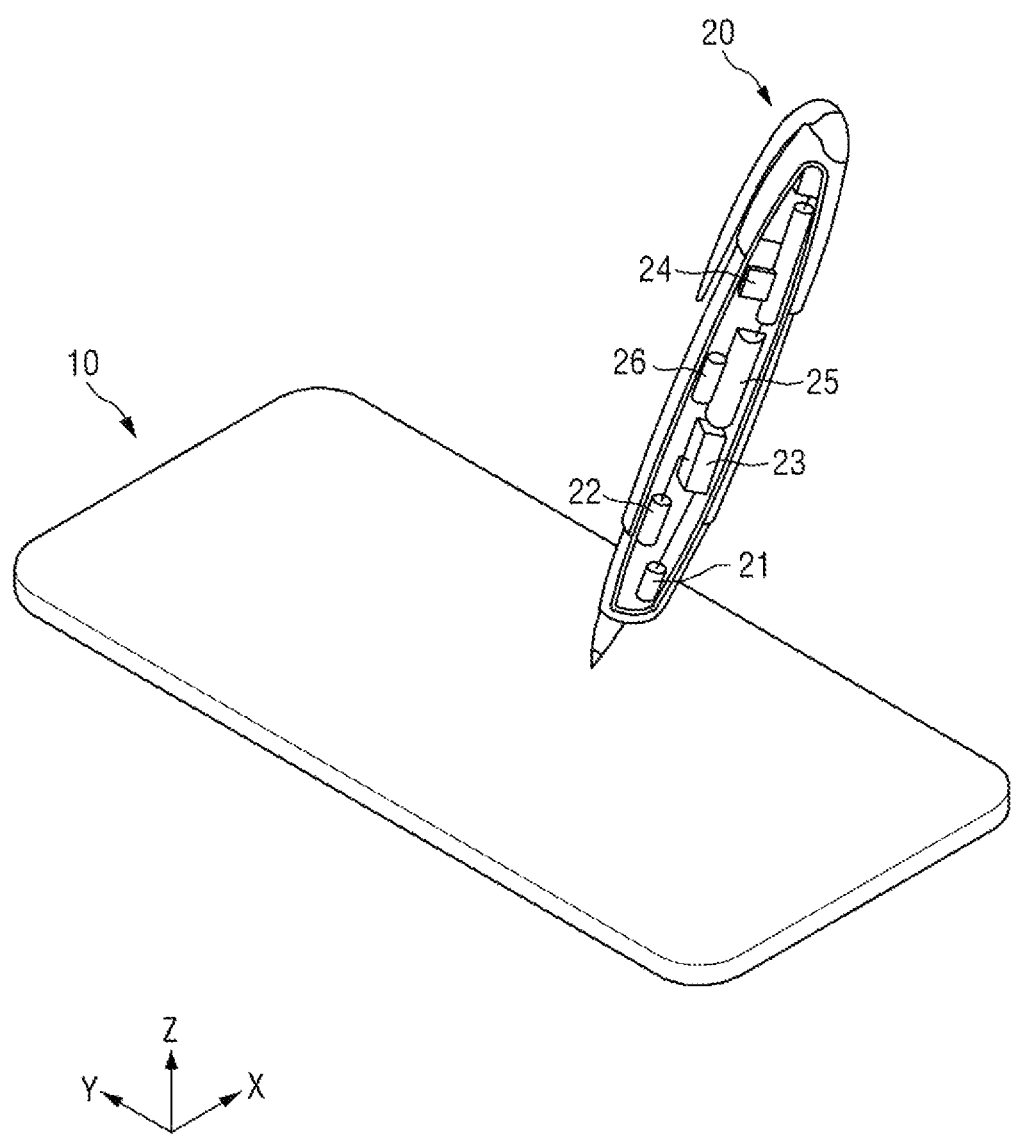
FIG. 19 is a perspective view illustrating a sensing system according to an embodiment of the present disclosure.
Figure 20:
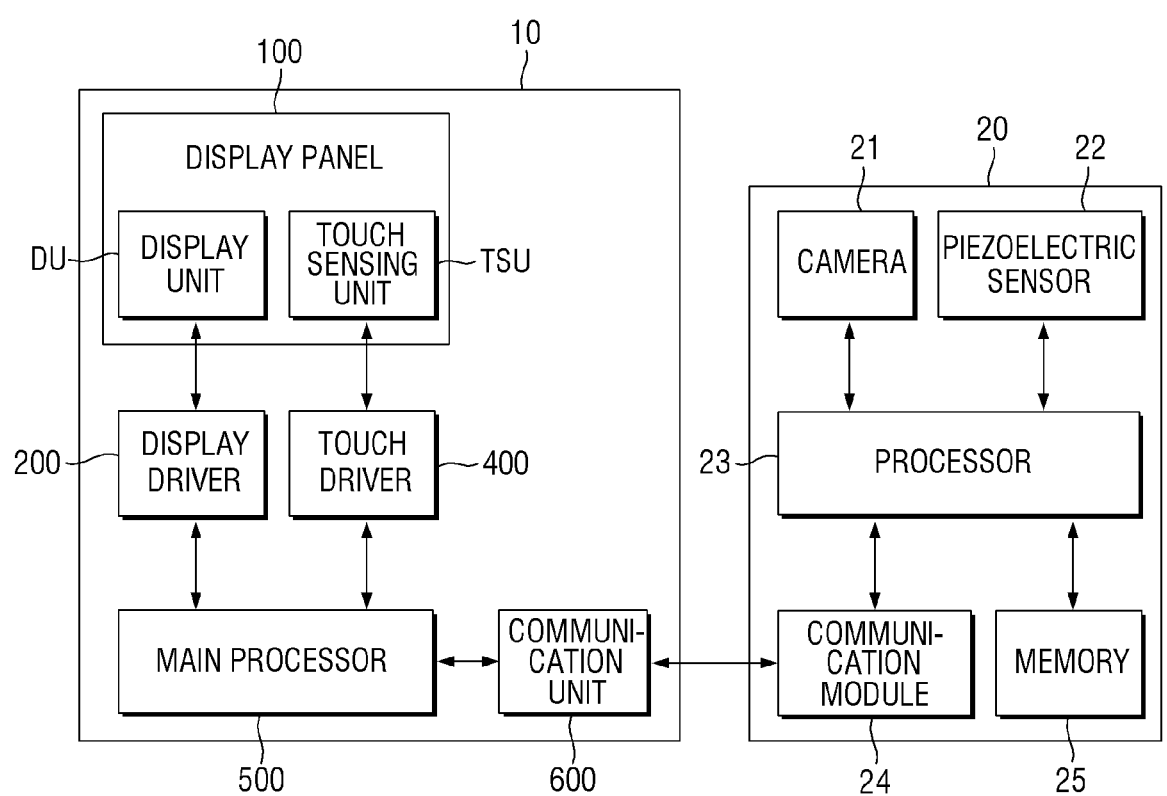
FIG. 20 is a block diagram illustrating a display device and an input device in a sensing system according to and embodiment of the present disclosure.

FIG. 19 is a perspective view illustrating a sensing system according to an embodiment of the present disclosure. FIG. 20 is a block diagram illustrating a display device and an input device in a sensing system according to an embodiment of the present disclosure.

Referring to FIGS. 19 and 20, a sensing system may include a display device 10 and an input device 20.

The display device 10 may include a display panel 100, a display driver 200, a touch driver 400, a main processor 500, and a communication transceiver 600.

The display panel 100 may include the display DU and the touch sensing element TSU. The display DU may include a plurality of pixels to display an image.

The touch sensing element TSU may include the plurality of touch electrodes SEN to sense a user's touch in a capacitive manner. The display device 10 may include the code pattern CP to detect a touch of the input device 20. The code pattern CP may have position information determined by the planar shape of the bridge electrode CE or the light blocking pattern BSL. At least one code pattern CP or a combination of the code patterns CP may correspond to a preset data code value.

The display driver 200 may output signals and voltages for driving the display DU. The display driver 200 may supply data voltages to data lines. The display driver 200 may supply a power voltage to the power line and may supply gate control signals to the gate driver.

The touch driver 400 may be connected to the touch sensing element TSU. The touch driver 400 may supply a touch driving signal to a plurality of touch electrodes SEN of the touch sensing element TSU and may sense an amount of change in capacitance between the plurality of touch electrodes SEN. The touch driver 400 may calculate whether a user's input is made and input coordinates based on an amount of change in capacitance between the plurality of touch electrodes SEN.

The main processor 500 may control all functions of the display device 10. For example, the main processor 500 may supply digital video data to the display driver 200 such that the display panel 100 displays an image. For example, the main processor 500 may receive touch data from the touch driver 400 and determine a user's input coordinates, and then generate digital video data according to the input coordinates, or execute an application indicated by an icon displayed at the user's input coordinates. In an example, the main processor 500 may receive coordinate data from the input device 20 and determine input coordinates of the input device 20, and then generate digital video data according to the input coordinates, or execute an application indicated by an icon displayed at the input coordinates of the input device 20.

The communication transceiver 600 may perform wired/wireless communication with an external device. For example, the communication transceiver 600 may transmit/receive communication signals to/from a communication module 24 of the input device 20. The communication transceiver 600 may receive coordinate data composed of data codes from the input device 20, and may provide the coordinate data to the main processor 500.

The input device 20 may include a camera 21, a piezoelectric sensor 22, a processor 23, the communication module 24, a memory 25, and a battery 26. For example, the input device 20 may be an input stylus that generates coordinate data using an optical method. The input stylus may be a smart stylus, an electromagnetic stylus, or an active stylus, but is not necessarily limited thereto.

The camera 21 may be disposed in front of the input device 20. The camera 21 may photograph the code pattern CP determined by the planar shape of the bridge electrode CE or the light blocking pattern BSL. The camera 21 may continuously photograph the code pattern CP of the corresponding position according to the movement of the input device 20. The camera 21 may provide the captured image to the processor 23.

The piezoelectric sensor 22 may sense the pressure applied by the input device 20 to the display device 10. The piezoelectric sensor 22 may provide pressure information of the input device 20 to the processor 23.

The processor 23 may receive an image of the code pattern CP from the camera 21. The processor 23 may convert the code pattern CP into a corresponding data code and may generate coordinate data by combining the data codes. The processor 23 may transmit the generated coordinate data to the display device 10 through the communication module 24.

The processor 23 may receive the image of the code pattern CP and convert the plurality of code patterns CP into data codes corresponding one-to-one, thereby rapidly generating coordinate data without complex calculation and correction. Accordingly, the sensing system may reduce cost, reduce power consumption, and simplify the driving process. In addition, since the sensing system includes a plurality of code patterns CP provided on the touch sensing element TSU, the color filter layer CFL, or the wavelength conversion layer WLCL, it might not be restricted by size and may be applied to all electronic devices having a touch function.

The communication module 24 may perform wired/wireless communication with an external device. For example, the communication module 24 may transmit/receive a communication signal to/from the communication transceiver 600 of the display device 10. The communication module 24 may receive coordinate data composed of data codes from the processor 23 and may provide the coordinate data to the communication transceiver 600.

The memory 25 may store data for driving the input device 20. Since the input device 20 may convert the plurality of code patterns CP into data codes corresponding one-to-one and provide coordinate data directly to the display device 10, it may include the memory 25 having a relatively small capacity.

What is claimed is:

1. A display device, comprising:
   a display panel including a plurality of emission areas each emitting light and a light blocking area at least partially surrounding the plurality of emission areas;
   a plurality of touch electrodes disposed in the light blocking area on the display panel, each of the plurality of touch electrodes being configured to sense a touch;
   a wavelength absorption layer disposed on the plurality of touch electrodes, the wavelength absorption layer configured to absorb infrared or ultraviolet light;
   a bridge electrode disposed directly on the wavelength absorption layer, the bridge electrode connecting adjacent touch electrodes among the plurality of touch electrodes to each other; and
   a code pattern including position information having a planar shape of the bridge electrode connecting the adjacent touch electrodes.

2. The display device of claim 1, wherein the wavelength absorption layer is disposed in the plurality of emission areas or the light blocking area.

3. The display device of claim 1, wherein the code pattern has a closed loop shape.

4. The display device of claim 1, wherein the display panel comprises:
   a substrate;
   a thin film transistor layer disposed on the substrate and comprising a plurality of thin film transistors;
   a light emitting element layer disposed on the thin film transistor layer and including a plurality of light emitting elements; and
   an encapsulation layer covering the light emitting element layer,
   wherein the plurality of touch electrodes is disposed on the encapsulation layer.

5. The display device of claim 4, further comprising:
   a wavelength converter disposed on the display panel and corresponding to the plurality of emission areas, the wavelength converter configured to convert a peak wavelength of light provided from the plurality of light emitting elements; and
   a light blocker at least partially surrounding the wavelength converter part,
   wherein the plurality of touch electrodes is disposed on the light blocker, and the wavelength absorption layer is disposed on the plurality of touch electrodes, the wavelength converter, and the light blocker.

6. The display device of claim 4, further comprising:
a wavelength converter disposed on the wavelength absorption layer and corresponding to the plurality of emission areas, the wavelength converter configured to convert a peak wavelength of light provided from the plurality of light emitting elements; and
a light blocker at least partially surrounding the wavelength converter and covering the bridge electrode.

7. The display device of claim 1, further comprising a light blocking pattern disposed on at least a part of the bridge electrode to absorb light of a specific wavelength.

8. The display device of claim 1, wherein the display panel comprises:
a first substrate;
a thin film transistor layer disposed on the first substrate and comprising a plurality of thin film transistors; and
a light emitting element layer disposed on the thin film transistor layer and comprising a plurality of light emitting elements,
the display device further comprising:
a polarizing film disposed on the light emitting element layer; and
a second substrate disposed on the polarizing film,
wherein the plurality of touch electrodes is disposed on the second substrate.

9. A display device, comprising:
a display panel including a plurality of emission areas each emitting light and a light blocking area at least partially surrounding the plurality of emission areas;
a plurality of touch electrodes disposed in the light blocking area on the display panel, each of the plurality of touch electrodes being configured to sense a touch;
a wavelength absorption layer disposed on the plurality of touch electrodes, the wavelength absorption layer configured to absorb light of a specific wavelength;
a bridge electrode disposed on the wavelength absorption layer, the bridge electrode connecting adjacent touch electrodes among the plurality of touch electrodes to each other;
a code pattern including position information that is associated with a planar shape of the bridge electrode;
a plurality of color filters disposed in the plurality of emission areas on the wavelength absorption layer; and
a light blocker disposed in the light blocking area on the wavelength absorption layer,
wherein the light blocker covers the bridge electrode.

10. A display device, comprising:
a display panel including a plurality of emission areas configured to emit light and a light blocking area at least partially surrounding the plurality of emission areas;
a plurality of touch electrodes disposed in the light blocking area on the display panel, each of the plurality of touch electrodes being configured to sense a touch;
an insulating layer disposed on the plurality of touch electrodes;
a bridge electrode disposed on the insulating layer and connecting adjacent touch electrodes among the plurality of touch electrodes to each other;
a light blocking pattern disposed on at least a part of the bridge electrode, the light blocking pattern configured to absorb light of a specific wavelength; and
a code pattern having position information associated with a planar shape of the light blocking pattern.

11. The display device of claim 10, wherein the bridge electrode is reflective of a majority of either infrared or ultraviolet light, and the light blocking pattern is absorbent of either a majority of infrared or ultraviolet light.

12. The display device of claim 10, wherein the code pattern has a closed loop shape.

13. The display device of claim 10, wherein the display panel comprises:
a substrate;
a thin film transistor layer disposed on the substrate and comprising a plurality of thin film transistors;
a light emitting element layer disposed on the thin film transistor layer and comprising a plurality of light emitting elements; and
an encapsulation layer covering the light emitting element layer,
wherein the plurality of touch electrodes is disposed on the encapsulation layer.

14. The display device of claim 13, further comprising:
a wavelength converter disposed on the display panel and corresponding to the plurality of emission areas, the wavelength converter configured to convert a peak wavelength of light provided from the plurality of light emitting elements; and
a light blocker at least partially surrounding the wavelength converter,
wherein the plurality of touch electrodes is disposed on the light blocker, and the insulating layer is disposed on the plurality of touch electrodes, the wavelength converter, and the light blocker.

15. The display device of claim 13, further comprising:
a wavelength converter disposed on the insulating layer and corresponding to the plurality of emission areas, the wavelength converter configured to convert a peak wavelength of light provided from the plurality of light emitting elements; and
a light blocker at least partially surrounding the wavelength converter, the light blocker covering the bridge electrode and the light blocking pattern.

16. The display device of claim 10, further comprising:
a plurality of color filters disposed in the plurality of emission areas on the insulating layer; and
a light blocker disposed in the light blocking area on the insulating layer,
wherein the light blocker covers the bridge electrode and the light blocking pattern.

17. The display device of claim 10, wherein the display panel comprises:
a first substrate;
a thin film transistor layer disposed on the first substrate and comprising a plurality of thin film transistors; and
a light emitting element layer disposed on the thin film transistor layer and comprising a plurality of light emitting elements,
the display device further comprising:
a polarizing film disposed on the light emitting element layer, and
a second substrate disposed on the polarizing film,
wherein the plurality of touch electrodes is disposed on the second substrate.

18. A sensing system, comprising;
a display device configured to display an image; and
an input device configured to touch the display device,
wherein the display device comprises:
a display panel including a plurality of emission areas, each of the plurality of emission areas configured to emit light, and a light blocking area at least partially surrounding the plurality of emission areas;

a plurality of touch electrodes disposed in the light blocking area on the display panel, each of the plurality of touch electrodes configured to sense a touch;

a wavelength absorption layer disposed on the plurality of touch electrodes, the wavelength absorption layer configured to absorb infrared or ultraviolet light;

a bridge electrode disposed directly on the wavelength absorption layer, the bridge electrode connecting adjacent touch electrodes, among the plurality of touch electrodes, to each other; and a code pattern having position information having a planar shape of the bridge electrode connecting the adjacent touch electrodes, wherein the input device is configured to photograph the code pattern, convert the code pattern into a preset data code, and transmit coordinate data associated with the preset code to the display device.

19. The sensing system of claim 18, wherein the input device comprises:

a camera configured to photograph the code pattern;

a processor configured to analyze an image of the code pattern, convert the code pattern into a preset data code, and generate coordinate data associated with the preset data code; and a communication module configured to transmit the coordinate data to the display device.

* * * * *